US008898537B2

(12) United States Patent  
Gross et al.

(10) Patent No.: US 8,898,537 B2  
(45) Date of Patent: Nov. 25, 2014

(54) METHOD AND SYSTEM FOR DECODING

(75) Inventors: Warren Gross, Montreal (CA); Francois Leduc-Primeau, Montreal (CA); Saied Hemati, Montreal (CA); Shie Mannor, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 402 days.

(21) Appl. No.: 13/050,065

(22) Filed: Mar. 17, 2011

(65) Prior Publication Data

US 2011/0231731 A1    Sep. 22, 2011

Related U.S. Application Data

(60) Provisional application No. 61/314,778, filed on Mar. 17, 2010.

(51) Int. Cl.
*H03M 13/00* (2006.01)
*H03M 13/11* (2006.01)
*H03M 13/25* (2006.01)

(52) U.S. Cl.
CPC ........ *H03M 13/255* (2013.01); *H03M 13/6544* (2013.01); *H03M 13/1377* (2013.01); *H03M 13/6597* (2013.01); *H03M 13/1125* (2013.01); *H03M 13/1111* (2013.01); *H03M 13/1165* (2013.01); *H03M 13/658* (2013.01); *H03M 13/1134* (2013.01)
USPC .......................................... 714/758; 714/774

(58) Field of Classification Search
CPC ..................... H03M 13/1125; H03M 13/3911
USPC .................................................. 714/758, 774
See application file for complete search history.

(56) References Cited

U.S. PATENT DOCUMENTS

| | | | | |
|---|---|---|---|---|
| 2004/0174939 A1* | 9/2004 | Wang | ............................ | 375/316 |
| 2007/0033510 A1* | 2/2007 | Xu | ................................ | 714/796 |
| 2008/0072122 A1* | 3/2008 | Nimbalker et al. | ........... | 714/774 |
| 2009/0041145 A1* | 2/2009 | Chockalingam et al. | ..... | 375/261 |
| 2009/0282320 A1* | 11/2009 | Liao et al. | ..................... | 714/784 |

OTHER PUBLICATIONS

Leduc-Primeau et al., A Relaxed Half-Stochastic Iterative Decoder for LDPC Codes, 2009, IEEE GLOBECOM, pp. 1-6.*

* cited by examiner

*Primary Examiner* — M. Mujtaba K Chaudry  
(74) *Attorney, Agent, or Firm* — The Law Office of Michael E. Kondoudis

(57) ABSTRACT

Low-Density Parity-Check (LDPC) codes offer error correction at rates approaching the link channel capacity and reliable and efficient information transfer over bandwidth or return-channel constrained links with data-corrupting noise present. LDPC codes also offer error correction performance approaching channel capacity exponentially fast in terms of the code length, linear processing complexity, and parallelism that scales with the code length. They also offer challenges relating to the decoding complexity of the binary error-correction codes themselves and error floors limiting achievable bit-error rates. A new Relaxed Half-Stochastic (RHS) decoding algorithm is presented that reduces decoding complexity for high decoding throughput applications. The RHS algorithm uses an approach based on stochastic decoding algorithms but differs significantly from the conventional approaches of LDPC decoder implementation. The RHS algorithm also leads to a randomized decoding technique called redecoding that addresses the error floor limitation.

10 Claims, 9 Drawing Sheets

METHOD AND SYSTEM FOR DECODING

CROSS-REFERENCE TO RELATED APPLICATION

This patent application claims the benefit of U.S. Provisional Patent Application 61/314,778 filed Mar. 17, 2010 entitled "A Method and System for Encoding."

FIELD OF THE INVENTION

The invention relates to decoding of error correction codes and in particular to a method and system of decoding Low Density Parity Check (LDPC) codes.

BACKGROUND OF THE INVENTION

Low-Density Parity-Check (LDPC) codes are a type of linear error-correcting codes that are part of the family of linear block codes, which transform a message consisting of a sequence of information symbols of an alphabet into a fixed length sequence of encoding symbols. With linear block codes the input message length is less than the number of encoding symbols thereby providing redundancy allowing for detection and correction of errors. LDPC codes were originally invented by Gallager, see "Low Density Parity-Check Codes" (Monograph, M.I.T. Press, 1963), but little attention was devoted to them at the time, primarily because the required decoding complexity was too high for the processing resources that were available. In 1993, the introduction of turbo codes by Berrou, Glavieux and Thitimajshima, see "Near Shannon Limit Error-correcting Coding and Decoding: Turbo-codes" (Proc. IEEE Intl. Comm. Conf., pp 1064-1070, 1993), spurred interest for codes that could achieve error correction at rates approaching the channel capacity of the link they were applied upon. In the intervening 30 years semiconductor devices had gone from expensive Small Scale Integrated Circuits with tens to hundreds of transistors to consumer electronics such as Intel's fifth-generation microarchitecture, the P5 or Pentium, with 3 million transistors. LDPC codes were rediscovered by MacKay in the mid-1990s, see D. J. C. MacKay et al in "Near Shannon Limit Performance of Low Density Parity Check Codes" (Electronics Letters, vol. 32, pp. 1645-1646, August 1996).

LDPC codes are interesting mainly for two reasons. First, they offer an error correction performance that approaches the channel capacity exponentially fast in terms of the code length. Second, the decoding process has linear complexity and a high degree of parallelism that scales with the code length. LDPC codes are capacity approaching codes, meaning that practical constructions exist that allow transmitting information at a signal-to-noise ratio that is very close to the theoretical minimum, known as the Shannon limit. Using iterative belief propagation techniques, LDPC codes can be decoded in time linearly to their block length, a factor particularly beneficial as data rates in communication systems continue to increase.

LDPC codes, therefore, are finding increasing use in applications where reliable and highly efficient information transfer is desired. Although implementation of LDPC codes has lagged that of other codes, notably turbo codes, they are increasingly becoming the standard for error-correction in applications including, but not limited to:

Digital Video Broadcasting-Satellite-Second Generation (DVB-S2) standard;

Forward Error Correction (FEC) within the ITU-T G.hn home network standard providing data rates up to 1 Gb/s over power lines, phone lines and coaxial cables;

IEEE 802.16e WiMAX;

IEEE 802.16n WiFi; and

IEEE 802.3an (10GBase-T Ethernet on CAT6 cables, which operates at 10 Gb/s).

Of significant importance for such applications, which address high-speed applications in essentially consumer markets, is the ability to implement economically and technically viable decoder circuits, since typically the implementation of the encoder is much less complex. By viable we mean one where the circuits have small die area, and hence low manufacturing cost, efficient power performance, and good processing performance in terms of throughput and latency, yet preserves the error-correction capability of the code.

The design of practical decoding algorithms does not focus so much on the coding gain offered by one code compared to another, but rather on the performance of a given algorithm on a given code. The aim is to optimize error-correction performance versus cost on the widest possible range of codes. Accordingly, throughout the following specification, cost is assessed at the algorithm level, and hence in general terms. Definitive comparisons of the performance/cost ratios of different algorithms can only be made based on actual circuit implementations, but algorithmic efficiencies in component count, speed etc may be implied as offering financial benefit.

At present amongst the challenges related to the decoding of LDPC codes are the decoding complexity of binary error-correction codes themselves and error floors. Decoding complexity for example means that today the codes chosen for IEEE 802.16e WiMAX and IEEE 802.3an Ethernet standards perform roughly 3 dB away from capacity, in part due to the cost of decoding circuits. Accordingly, reducing decoder cost using improved algorithms therefore permits increased efficiency of channel use in such applications.

The phenomenon of error floors refers to the fact that LDPC codes can loose error-correction efficiency when the target error rate is very low. This problem is sometimes studied at the level of the code design, but given that the behavior is influenced by the choice of decoding algorithm and by implementation constraints, it is also possible to address this issue at the algorithm level.

According to embodiments of the invention a new decoding algorithm for LDPC codes is presented that reduces decoding complexity for applications that require high decoding throughput. This algorithm, called the Relaxed Half-Stochastic (RHS) algorithm, uses an approach based on stochastic decoding algorithms, which differs significantly from the conventional approaches of LDPC decoder implementation. Additionally, the RHS algorithm has led, according to other embodiments of the invention, to the invention of a randomized technique called redecoding for addressing the error floor issue. This is the first time, to the inventors knowledge, that such an approach has been taken for reducing error floors, and simulations have shown the error floor can be moved down by several orders of magnitude.

Accordingly, the invention addresses the issues of decoding complexity in high-speed communication systems, thereby allowing reduced cost for implemented decoder circuits, and error floor reduction, thereby allowing improved link performance.

SUMMARY OF THE INVENTION

It is an object of the present invention to

In accordance with an embodiment of the invention there is provided a device comprising:

a generator receiving at an extrinsic input data relating to a transmission channel and applying a process to the extrinsic input to generate a first output, the first output generated in dependence upon at least a probability calculation and a relaxation factor;

a summation node connected to the generator to receive the output, receive a factor relating to the transmission channel, and generate a summation result;

a uniform random number generator to generate a second output, the second output generated in dependence upon at least a probability calculation; and a comparator generating a code in dependence upon the summation result and the second output.

In accordance with an embodiment of the invention there is provided a method comprising:

providing a generator receiving at an extrinsic input data relating to a transmission channel and applying a process to the extrinsic input to generate a first output, the first output generated in dependence upon at least a probability calculation and a relaxation factor;

providing a summation node connected to the generator to receive the output, receive a factor relating to the transmission channel, and generate a summation result;

providing a uniform random number generator to generate a second output, the second output generated in dependence upon at least a probability calculation; and providing a comparator generating a code in dependence upon the summation result and the second output.

In accordance with an embodiment of the invention there is provided a method comprising:

providing a decoder receiving encoded data according to a first predetermined standard on a transmission channel, the decoder operating in dependence of a relaxation factor;

operating the decoder to process received encoded data wherein the relaxation factor is employed in an initial process applied to the received encoded data; and generating decoded data according to a second predetermined standard.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
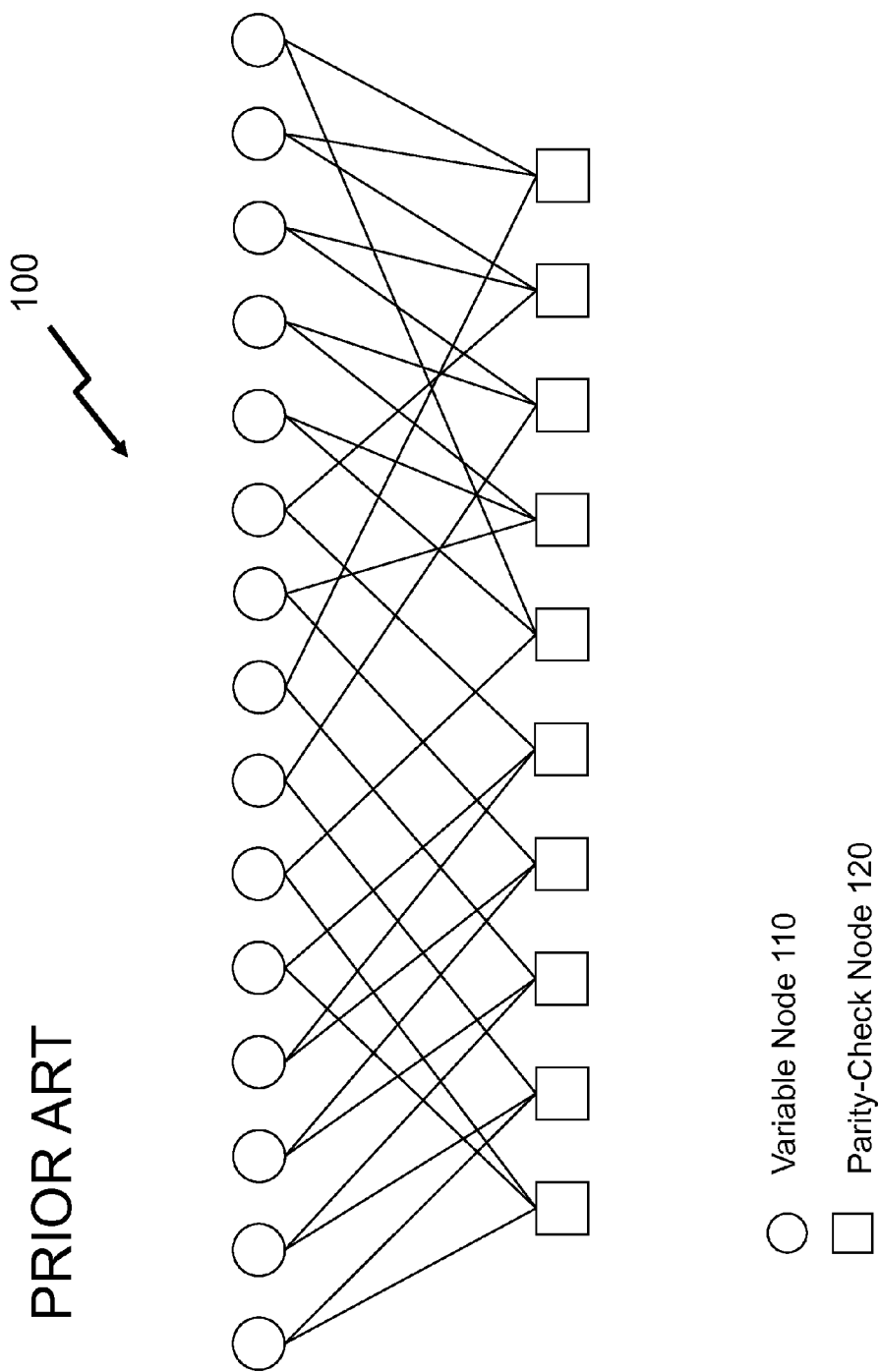
FIG. 1 is a schematic depicting a bipartite graph that expresses the relationship between independent variables and local functions.

The present invention is directed to decoding of error correction codes and in particular to a method and system of decoding Low Density Parity Check (LDPC) codes. Within the following description an overview of the encoding and decoding of information on a physical transmission medium is presented together with descriptions of prior art and the issues arising from these that are addressed at least in part by algorithms according to embodiments of the invention.

Channel Coding:

Within the following discussions we will consider a physical channel which corrupts the information transmitted, the corruption being modeled through the additive white Gaussian noise (AWGN). A transmission through the AWGN channel can be characterized by a signal-to-noise ratio (SNR), transmissions rate R, expressed in bits/second (b/s), and a bandwidth W, expressed in Hertz. We can then define the spectral efficiency of the AWGN channel as $\eta=R/W$ b/s/Hz. For a given SNR, it can be shown that, there is a fundamental limit on the achievable spectral efficiency of an error-free transmission.

Given that modulated symbols are transmitted on the channel at a rate of 2B symbols/s, the discrete time rate is defined as $r=R/2B$ bits/symbol. Assuming that the transmission uses all the available bandwidth, then by Nyquist theory, it is possible to send 2W symbols/s on the AWGN channel. The discrete-time rate of the transmission is then $r=R/2W$, or equivalently the spectral efficiency is $\eta=2r$, which is known as the nominal spectral efficiency.

A channel code is a scheme for mapping a sequence of information bits to a sequence of symbols. The structure of such a code is characterized by its rate r, and its performance by the relationship between SNR and bit error rate. For binary codes, $r<1$, and as a result their spectral efficiency is at most $\eta \le 2$ b/s/Hz. $\eta \le 2$ being known as the power-limited regime. It corresponds to situations where a transmission is mostly constrained by SNR rather than available bandwidth. In the power-limited regime, coding performance is typically presented in terms of SNR normalized with respect to the spectral efficiency (SNR/$\eta$). This corresponds to the expression $E_b/N_o$, where $E_b$ is the energy per information bit, and $N_o=2\sigma^2$ is the double-sided noise power (where $\sigma^2$ is the variance of the Gaussian noise).

Shannon in "Communication in the Presence of Noise" (Proc. Institute of Radio Engineers, Vol. 37, Iss. 1, pp 10-21) showed that for an AWGN channel having bandwidth W, the rate if transmission R is upper bounded by $R<W \log_2(1+SNR)$. Shannon also showed that there exist channel codes that will allow this rate to be achieved whilst incurring an arbitrarily low probability of error. Equivalently the measure $E_b/N_o$ is lower bounded by:

$$\frac{E_b}{N_o} = \frac{2^\eta - 1}{\eta} \qquad (1)$$

However an important aspect of using binary codes is that they cannot achieve the nominal spectral efficiency of 2r. For rates r≤½, the SNR limit for binary codes is less than 0.2 dB away from the general limit, but the gap increases as the rate, r, approaches 1. For example, the Shannon limit on SNR for a binary code having a rate of 0.84 is approximately 2.436 dB, while the general limit for the nominal spectral efficiency of η=2r=1.68 is 1.31 dB.

Code Structure and Encoding:

The underlying principle behind all forms of error correction is the superposition of some structure to the data being transmitted, so that the receiver can make use of the structure to recover transmission errors. In the case of binary linear block codes, the structure (or constraints) of the code can be defined in terms of a set of (n−k) parity-check equations that are applied to the codewords, where k is the length of an uncoded source message and n is the length of a codeword (with n>k). A valid codeword is one for which all parity-check equations are even. This set of parity-check equations can be represented using a matrix H, with each row of H describing a parity-check and each column representing an element of the codeword. The set of valid codewords C is then composed of all row vectors $H\underline{c}^T=\underline{0}^T$, i.e. C=N(H), the nullspace of H. In the case of binary LDPC codes, the elements of H are taken from the finite field {0,1}, and all operations are modulo 2.

The key characteristic of LDPC codes is that their H matrix is sparse, meaning that the number of elements in each parity-check equation is small, and does not grow with the code length. LDPC codes can be divided in two sub-categories: regular and irregular codes. Regular codes were the codes originally proposed by Gallager. They have the property that each codeword bit is included in a fixed number of parity-check equations, and that each parity-check equation includes a fixed number of codeword bits. Equivalently, in terms of the H matrix, each column has a fixed number $d_v$ of 1's, and each row has a fixed number $d_c$ of 1's. This type of code is referred to as a regular $(d_v, d_c)$ code. In the case of irregular codes, each column and row of the matrix can have varying weights, but the column and row weights are taken respectively from two finite sets.

In the general case a codeword $\underline{c}$ can be encoded by multiplying the information sequence $\underline{u}$ with G ($\underline{c}=\underline{u}G$). For LDPC codes, H is a sparse matrix, but G is dense. It would therefore seem that in the general case the encoding operation has complexity $O(n^2)$. However, Richardson and Urbanke in "Efficient Encoding of Low-Density Parity-Check Codes" (IEEE Trans. Information Theory, Vol. 47, pp 638-656. 2001) show that for randomly chosen codes, the encoding can be performed with linear complexity (with high probability) by first converting H to an approximate lower triangular form. While linear, the encoding process remains fairly involved, requiring multiple sparse matrix vector multiplications.

It is also possible to design the code so that it is cyclic or quasi-cyclic, see Code Design below. The LDPC codes with this property form a subset of all possible LDPC codes. A linear block code is said to be cyclic if any cyclic shift of a codeword yields another valid codeword. If a code is cyclic, it can be specified in terms of a single generator polynomial, and the encoding can be performed using a shift register of size n−k. Similarly a code is quasi-cyclic if a cyclic shift of any codeword by $n_o$ positions with $n_o>1$ yields another codeword. Quasi-cyclic codes can also be encoded using a shift register.

Decoding of LDPC Codes:

The structure of an LDPC code can be described in terms of a factor graph, which is a bipartite graph that expresses the relationship between independent variables and local functions. In the context of LDPC codes, the independent variables are the likelihood associated with the codeword bits, which are involved in some parity-check equations (the local functions). An example of such a graph 100 is shown in FIG. 1, where the variable nodes 110 are represented as circles, and the parity-check nodes 120 (or check nodes) as squares. An edge, depicted as a line, connects the $i^{th}$ variable node 110 and $j^{th}$ check node 120 if the $i^{th}$ codeword bit is included in the $j^{th}$ parity-check equation, or equivalently if $H_{i,j}=1$. In a regular code, all variable nodes have degree $d_v$, and all check nodes have degree $d_c$.

Maximum Likelihood Decoding:

If we assume that the transmitter can send any one of the $2^k$ codewords with equal probability, then an optimal decoder will decode to the codeword that maximizes the probability of observing the received vector y as determined by Equation 2 below.

$$\text{argmax}_{x \in C} p_{Y|X}(y|x) \qquad (2)$$

This is known as Maximum Likelihood (ML) decoding. For binary phase-shift keying (BPSK) transmission upon the AWGN channel, the conditional probability density function (PDF) of each received value is given by Equation 3 below.

$$p_{Y|X}(y \mid x) = \frac{1}{\sigma\sqrt{2\pi}} \exp\left(\frac{-(y-x)^2}{2\sigma^2}\right) \qquad (3)$$

Since all the received values are independent and identically distributed then the joint PDF can be described by Equation 4 below.

$$p_{\underline{Y}|\underline{X}}(\underline{y} \mid \underline{x}) = \prod_{i=1}^{n} p_{Y|X}(y_i \mid x_i) \qquad (4A)$$

$$= \frac{1}{\sigma\sqrt{2\pi}} \exp\left(\frac{1}{2\sigma^2} \sum_{i=0}^{n} (y_i - x_i)^2\right) \qquad (4B)$$

By taking the logarithm and then the square root, we obtain an equivalent expression for Equation 2, namely Equation 5.

$$\text{argmin}_{x \in C} \left(\sum_{i=1}^{n} (y_i - x_i)^2\right) \qquad (5)$$

From this we conclude that finding the codeword having the minimum Euclidian distance to the received vector in the BPSK domain will generate the maximum likelihood estimate.

Optimization Problem:

Finding the most likely transmitted codeword may be formulated as an optimization problem. The decoding algorithm must process a sequence of received information to determine the most likely transmitted codeword. In the most general case, this information is in the form of a likelihood that each transmitted bit was a zero. Different metrics can be used for representing the likelihood, but the log-likelihood ratio (LLR) is most often used. The LLR metric $\Lambda$ is defined in terms of probabilities by Equation 6 below.

$$\Lambda = \ln(p_0/p_1) \quad (6)$$

where $p_0 = P(X=0|Y)$ and similarly for $p_1$.

A common framework for optimization problems is to work with a global multivariate function that has the problem's parameters as arguments, which when decoding error-correction codes is the belief about each received value. For LDPC codes we can define the loss function as the likelihood that all parity-check equations are not satisfied. This is expressed in the LLR domain is given by Equation 7; namely $$L(\Lambda) = -\sum_{i=0}^{n-k} v_i(\Lambda) \quad (7)$$

where n−k is the number of independent parity-check equations, $v_i$ is the LLR domain likelihood that the $i^{th}$ parity-check equation is satisfied, and $\Lambda$ is a vector of LLR values of length n corresponding to an estimate of the a-posteriori likelihood of each bit.

Maximum likelihood based decoding introduced supra is not feasible in practice because it requires evaluating the distance of the received vector for all the $2^k$ codewords in C. To find an approximate solution, the iterative optimization approach is to update the current a-posteriori estimate in search of an estimate that minimizes the loss function. Note that because of the structure of LDPC codes, the functions $v_i$, which compose the loss function are actually only local functions of a few variables. This fact can be exploited to derive a low complexity iterative algorithm that is used in practice, known as the Sum-Product Algorithm (SPA).

The Sum-Product Algorithm:

The Sum-Product Algorithm is a soft-input/soft-output scheme that takes as input the vector of a-priori likelihood values corresponding to the received channel values, and outputs an estimation of the a-posteriori likelihoods of each codeword bit. The algorithm is defined on the factor graph of the code. In the hypothetical case where the graph is cycle-free, the graph can be redrawn as n trees, each having one of the n variable nodes as root, without duplicating any edge. In that case, the a-posteriori estimation of each codeword bit can be computed recursively on its associated computation tree. This produces the maximum likelihood estimation for each codeword bit separately, which is not equivalent to the joint maximum likelihood estimation on the whole codeword.

Unfortunately, cycle-free codes do not offer a good error correction performance. It can be shown that such codes have a high number of low-weight codewords, see for example Richardson et al in "Modern Coding Theory" (Cambridge University Press). However, even in the presence of cycles, the SPA has been found to be a good approximation to maximum-likelihood decoding. In the presence of cycles, the factor graph can no longer be expanded as n trees, but messages are still propagated in the same way. Accordingly, to propagate messages from a node A, A successively regards each of its neighbors as its parent, and all other neighbors as its children. As in a computation tree, incoming messages from the children are used as input to the function $f_A$ associated with node A, and the result is propagated to the parent. Cycles in the graph do have an adverse effect on the decoding performance, with shorter cycles having more impact than longer ones. For this reason, code design techniques usually try to avoid generating short cycles in the graph. The complete algorithm proceeds as follows:

Initialization: For each received channel value, compute a-priori likelihood metric $L_i$, $1 \le i \le n$. Each variable node sends $L_i$, to adjacent check nodes.

Loop: Each check node sends messages to all adjacent variable nodes. A check node j sends message $\upsilon_{j \to i}$, to variable node i. Each variable node i then sends messages $\mu_{i \to j}$, to all adjacent check nodes. Each variable node also determines the current hard-decision based on all its inputs.

Termination: The algorithm terminates when the vector of the hard-decisions is a valid codeword, or when a predetermined number of iterations has been reached (in which case the algorithm declares a decoding failure).

Message Representation:

The messages in SPA can be expressed in a variety of formats. The most straight-forward representation is of course a probability value, but any likelihood metric can be used. The choices of representation affects the variable and check node update functions, and can affect the algorithm's performance, especially when quantization comes into play. The Log-Likelihood Ratio (LLR) representation, defined earlier in Equation 6, is commonly used in implementations because it makes the variable node outputs very simple to compute, and because it is more efficient numerically. An additional benefit of using LLR's for hardware implementations is that the sign bit directly represents the hard-decision associated with the likelihood.

When using the LLR message representation, the a-priori likelihood is computed using Equation 8 for the case of binary antipodal modulation on the AWGN channel, where $y_i$ is the received modulated value and $N_o = 2\sigma^2$ is the one-sided noise power. The minus sign is dependent on the mapping of source symbols $\{0,1\}$ to modulation symbols $\{-1,+1\}$, and on the definition of the LLR metric, Equation 6. The output of the variable and check nodes can then be computed using respectively Equations 8 and 10, where i is the variable node index, j the check node index, $V_{i\backslash j}$ the set of check nodes connected to variable node i (excluding check node j) and $C_{j\backslash i}$ the equivalent for check nodes.

$$\Lambda = \frac{-4y_i}{N_o} \quad (8)$$

$$\mu_{i \to j} = \Lambda_i + \sum_{l \in V_{i \backslash j}} \upsilon_{l \to i} \quad (9)$$

$$v_{i \to j} = 2\tanh^{-1}\left(\prod_{l \in C_{j \backslash i}} \tanh\left(\frac{\mu_{l \to j}}{2}\right)\right) \quad (10)$$

The Min-Sum Algorithm:

SPA decoding using LLR messages has the advantage of having computationally inexpensive equations for computing the a-priori likelihood, given by Equation 8, and the variable node outputs, given by Equation 9/However, the check node output equation, see Equation 10, is more expensive and can be implemented in hardware using look-up tables, but since a decoder implementation will have to perform a big number of such calculations in parallel, a less expensive computation is highly desirable. The Min-Sum algorithm replaces Equation 10 with an approximation that is cheaper and yet provides reasonably good accuracy. The new check node output equation is given by Equation 11 below.

$$v_{j \to i} = \left(\prod_{l \in C_{j \setminus i}} \text{sgn}(\Lambda_l)\right)\left(\min_{l \in C_{j \setminus i}} \Lambda_l\right) \quad (11)$$

Successive Relaxation:

The decoding algorithms presented until now propagate information from node to node in discrete steps. However, belief propagation can also be performed in continuous-time, which leads to consideration of analog circuit implementations. It is shown by Hemati et al in "Dynamics and Performance Analysis of Analog Iterative Decoding of LDPC Codes" (IEEE Trans. Comms, Vol. 54, No. 1, pp 61-70, 2006) that the dynamics of continuous-time belief propagation are different from its discrete-time counterpart, and can lead to better error-correction performance The inventors have analyzed in contrast the iterative belief propagation as a fixed-point problem. This provides a unifying framework for both discrete-time and continuous-time belief propagation.

To formulate the fixed-point problem, we consider a vector x composed of all the outputs of all the variable nodes, and vector y, similarly composed of the check node outputs. Of course x acts as the input to the check nodes, and y as the input to the variable nodes. Denoting by $f(\cdot)$ and $g(\cdot)$ as the operations of the variable nodes and check nodes respectively, then we have Equations 12 and 13 below:

$$f(y,r)=x \quad (12)$$

$$g(x)=r \quad (13)$$

where r is the vector of received information. Combining those two equations, we obtain a fixed-point equation, Equation 14, in terms of x.

$$f(g(x),r)=h(x,r)=x. \quad (14)$$

Discrete-time iterative belief propagation can then be viewed as the application of the well-known Successive Substitution method to the fixed point problem, where the iterative progression is of the form $$x_{i+1}=h(x_i,r) \quad (15)$$

Figure 2:
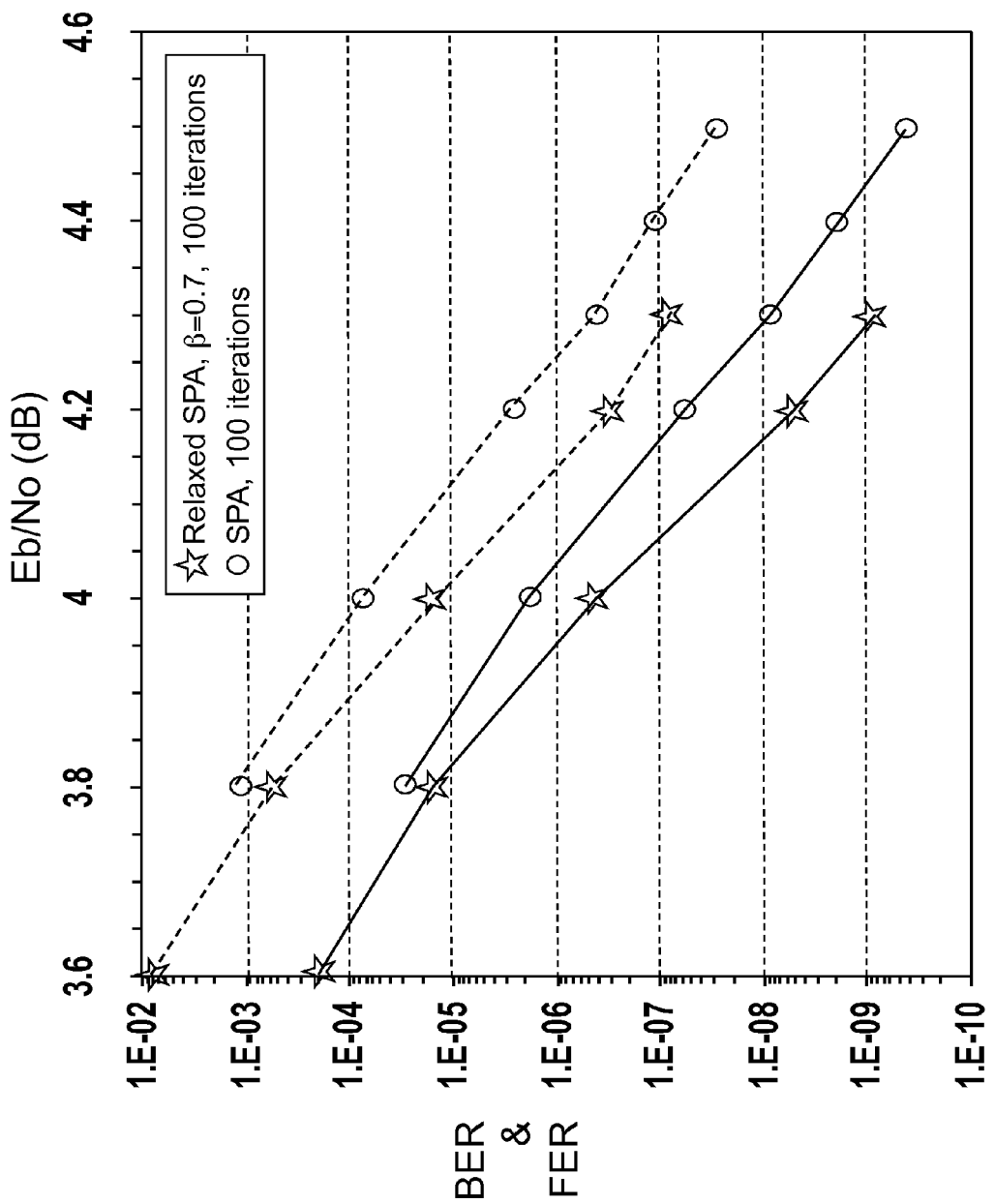
FIG. 2 depicts the BER/FER performance of relaxed SPA and conventional SPA decoders for 10 Gb/s Ethernet.

Other numerical methods exist for solving the fixed-point equation, such as the method of Successive Relaxation, also from the literature. The progression is then of the form $$x_{i+1}=x_i+\beta(h(x_i,r)-x_i) \quad (16)$$

where $\beta$ is known as the relaxation factor. The inventors have shown that for a belief propagation algorithm based on this iterative model, the dynamics tends to that of a continuous-time decoder as $\beta$ tends to zero. This provides an efficient way of simulating an "'ideal" analog decoder, but more importantly, since belief propagation in continuous-time has been observed to perform better than the discrete-time version, it provides a way of implementing a relaxed discrete-time decoder that performs better than a conventional decoder based on Successive Substitution. As an example, FIG. 2 compares the performance of the conventional SPA with relaxed SPA. The code used is a (6, 32) regular RS-LDPC code of length 2048 and rate 0.84 from the IEEE 802.3an standard for 10-Gb/s Ethernet over CAT6 cables.

Code Design:

For regular codes, constraints exist in the choice of variable and check node degrees, and the choice of a code length. Since short cycles in a code graph degrade the decoding performance, it is desirable to generate a code that avoids them. The girth of a code is defined as the length of the shortest cycle in the graph, and hence when designing a code we want the girth to be as large as possible. Cycles of length 4 can easily be avoided by adding the constraint that any two rows of the H matrix can have at most one 1 in the same position. In the case of longer cycles, it is possible to design algorithms that inspect the graph to break short cycles.

Irregular codes are a generalization of regular codes wherein a node can have a number of degree values. In that case the degree constraints take the form of two degree distribution polynomials, one for each type of node. The degree distribution polynomials specify both the set of allowable degrees as well as what proportion of the nodes should be of a given degree. The distribution polynomials are constrained by the fact that the number of edges connected to variable nodes must equal the number of edges connected to check nodes. Irregular codes offer more design flexibility than regular codes, and make it much easier to avoid short cycles.

The two degree distribution polynomials specify a code ensemble. A code is then a realization of a code ensemble of a specific length. The threshold of a code ensemble is defined as the worst channel parameter for which there exists a code length and a number of iterations that will allow reaching an arbitrarily small probability of bit error. Richardson et al in "Design of Capacity Approaching Irregular Low-Density Parity-Check Codes" (IEEE Trans. Inf. Theory, Vol. 47, No. 2, 2001) note that the thresholds of irregular LDPC codes increase with the maximum allowed variable node degree. However, this is not always the case for finite length codes and a finite number of iterations.

In addition to random constructions, various techniques have been developed to design the parity-check matrix in an algebraic or geometric way. The advantage of such an approach is that it permits enforcing a certain regularity in the matrix that can be used to simplify the implementation of encoders and decoders. Keeping in mind that LDPC codes are only interesting when the length used is sufficiently long (recent commercial codes use lengths above 1000, and even 64,800 for the DVB-S2 standard), it is easy to see that random-like interconnections between the nodes pose a big challenge for the physical implementation of SPA decoding. However, practical considerations aside, randomly generated irregular codes, such as the one presented by S-Y Chung et al in "On the Design of Low-Density Parity Check Codes within 0.0045 dB of the Shannon Limit" (IEEE Comms Lett., Vol. 5, pp 58-60, 2001), remain the best performing LDPC codes.

Circuit Architectures:

In general there are two possible ways for implementing the decoding graph in hardware. The first is the fully-parallel approach, where each node in the graph is assigned distinct hardware, while the other is the partially-parallel approach, where only a subset of the nodes are processed in parallel. In a partially-parallel design, each iteration of the belief propagation algorithm requires multiple sub-iterations in hardware.

Partially-Parallel Architectures:

The partially-parallel approach could also be called the processor approach, since it amounts to having a specialized processor that fetches messages from memory and handles the node level computations. Many nodes can potentially be processed in parallel, but as with any processor, this has to be balanced with memory bandwidth. Since the computations in the decoder are fairly simple, memory bandwidth is likely to be the bottleneck of a partially-parallel implementation. A possible solution for increasing memory efficiency, as well as reducing the complexity of the control logic, is to use code design techniques that enforce sonic desired regularity in the parity-check matrix.

Fully-Parallel Architectures:

For high throughput applications, it is desirable to exploit as much of the decoding algorithm's parallelism as possible, and therefore fully-parallel architectures are interesting candidates. However, the advantage of a fully parallel architecture is not only in the full use of the parallelism but that it also removes the need to maintain the current state of the graph in memory, since all the state information can be kept locally in each node. The lack of a central memory yields both throughput and power improvements.

As discussed previously the potential of LPDC codes is only realized for relatively long code lengths, see for example Richardson, wherein it is shown that irregular LDPC codes start outperforming turbo codes at a length of $10^4$, and as an example of recent commercial LDPC codes, the codes found in the IEEE 802.16e (WiMAX) and in the IEEE 802.3an (10 Gb/s Ethernet) standards have lengths of 1056 and 2048, respectively. Fully-parallel implementations are therefore challenging to realize A significant issue is the routing congestion which is a constraining factor on the circuit area of the implemented processor. This wiring complexity is of course due to the fact that the connections in the graph are random-like, which implies a high number of wire crossings as well as the presence of very long wires for long code lengths.

Accordingly, techniques for reducing the routing complexity are of great interest for fully-parallel implementations. The most obvious optimization consists in reducing the number of bits used to represent LLR messages. Blanksby et al in "A 690 mW 1 Gb/s 1024-b, Rate-½ Low-Density Parity-Check Code Decoder" represented messages using 4 bits, for a reported 0.2 dB of performance degradation with respect to floating-point. Another option is to transfer the message bits serially, see for example Darabiha et al in "A 3.3 Gb/s Bit-Serial Block-Interlaced Min-Sum LPDC Decoder in 0.1 μm CMOS" (Custom Integrated Circuits Conf. 2007). For this algorithm, it is straightforward to implement the variable node and check node operations in a bit-serial fashion, therefore this approach reduces the area usage outside the interleaver as well. The drawback is a reduced throughput, since many clock cycles are required to deliver each message, although Darabiha claims that the single-bit circuits allow for higher clock frequencies, and that therefore a bit-serial implementation has a throughput similar to a bit-parallel implementation.

Relaxed Half-Stochastic Decoding Algorithm:

Practical LDPC codes typically have lengths upward of $10^3$ bits, and decoding circuits that fully exploit the available parallelism of the code become challenging to implement. One of the main difficulties resides with the interleaver that delivers messages between the variable nodes and the check nodes, because of the unusually high ratio of interconnections to logic induced by the topology of the code's Tanner graph.

Stochastic decoding has been introduced as a low-complexity alternative to the sum-product algorithm (SPA) with the potential to achieve a similar performance However, only the decoding of short codes has resulted to date in compelling performance S. Sharifi Tehrani et al in "Stochastic Decoding of LDPC Codes" (IEEE Comms Lett., Vol. 10, pp 716-718, 2006, hereinafter Tehrani (1)) showed an improved stochastic decoding algorithm to achieve good decoding performance on larger codes. The decoder was refined, see S. Shafiri Tehrani et al in "Fully Parallel Stochastic LDPC Decoders" (IEEE Trans. Sig. Proc., Vol. 56, pp 5692-5703, 2008, hereinafter Tehrani (2)) allowing an FPGA implementation to be demonstrate for practical codes. Performance close to 64-iterations floating-point SPA was reported, see Tehrani (1), for codes of size 200 and 1024, but performance was achieved with a maximum iteration count of 10K and 60K, respectively. The results reported Tehrani (2) reduced the upper limit to 700 iterations, but the performance is approximately 0.5 dB away from 32-iterations floating-point SPA (at a BER of $10^{-8}$).

A very attractive aspect of stochastic decoders is that they only require two wires per bidirectional edge of the Tanner graph, therefore bringing the circuits interconnect to its simplest expression. The check nodes are also extremely simple, containing only XOR gates. This structure makes it realistic to consider fully-parallel implementations of long codes. This is of particular advantage for implementing codes with high-degree check nodes, such as the (6,32)-regular RS-LDPC code used in the IEEE 802.3an 10 Gb/s Ethernet standard. The check nodes for SPA and min-sum algorithm (MSA) decoders of this code have high-area implementations, even for bit-serial MSA decoders such as reported by Darabiha et al in "A Bit-Serial Approximate LDPC Decoder and FPGA Implementation" (IEEE Intl. Symp. Circuits and Systems, 2006) and Brandon et al in "A Scalable LDPC Decoder ASIC Architecture with Bit-Serial Message Exchange" (Integration—The VLSI Journal, Vol. 41, Iss. 3, 2008). In addition to the low complexity, another important advantage of stochastic decoders is the ability to add pipeline stages on some or all edges of the interleaver without affecting the error-correction performance, see for example Tehrani (2). This allows for higher clock rates and in ASIC implementations can facilitate the layout and routing.

According to embodiments of the invention a decoding algorithm called the Relaxed Half-Stochastic (RHS) Algorithm that uses the check node function of previous stochastic decoders, but uses a variable node function based on the SPA, is presented to address some of these limitations of the prior art. The motivation is to retain specific characteristics of stochastic algorithms, whilst improving the error-correction performance The RHS algorithm relies on the use of successive relaxation for converting messages between the stochastic and probability or LLR representations. Simulations show that the RHS algorithm significantly improves the BER performance, outperforming the floating-point SPA.

Existing Work on Stochastic Decoders:

Stochastic decoders represent the likelihood information in the form of binary stochastic streams, that is, random Bernoulli sequences of arbitrary length, and the information contained in a sequence is its first order statistics. This representation becomes useful when the data stream's mean function is interpreted as a probability. In that case, low-complexity variable nodes and check nodes can be designed, see for example V. Gaudet et al in "Iterative Decoding using Stochastic Computation" (Elect. Lett. Vol. 39, Iss. 3, pp 299-301). Despite the simple implementation, the stochastic stream representation can have arbitrary precision, and for this reason stochastic decoding was proposed as a low-complexity alternative to SPA decoding.

Considering the check node function of a degree-3 node (two inputs and one output), let the expected value of the current input bits be $p_0$ and $p_1$. Applying an XOR function on the inputs, the expected value of the output is $p_{OUT}=p_0q_1+q_0p_1$ (where $q_i=1-p_i$), which is the exact check node function of SPA in the probability domain Since the function does not reference any previous values of the input streams, it remains valid for non-stationary streams. This function is easily extended to higher degree nodes by combining together multiple degree-3 nodes, see for example Gaudet.

A number of functions have been proposed for the variable node operation, see for example Gaudet, Tehrani (1), and C. Winstead et al in "Stochastic Iterative Decoders" (Intl. Symp.

Inf. Theory, pp 1116-1120). The variable node function given below was introduced by Gaudet. This function is defined for a variable node of degree 3 (inputs {a,b}, output c) and has only 1 state bit. It can easily be shown that if each input stream is assumed stationary, the expected value of the output stream represents the desired probability, as given below in Equation 17.

$$c_i = a_i \text{ if } a_i = b_i \quad (17A)$$

$$c_i = c_{i-1} \text{ otherwise} \quad (17B)$$

Tehrani (1) showed that this approach suffers from an early error floor at BER=$10^{-3}$ when decoding a code of length 200. Two improvements that resolve this early floor were introduced in Tehrani (1). First, noise-dependent scaling consists of scaling down the a-priori channel likelihoods in order to increase the switching activity in the stochastic streams The variable node function is also modified to include memory, referred to as an edge-memory. To this end, the inventors define regenerative bits as the output of Equation 17 in the case of equality of the inputs. The memory is used much in the same way as the single state bit of Equation 17, but stores many regenerative bits. When the current output $c_i$, is not regenerative, a bit is instead sampled randomly from the edge-memory. S. Shafiri Tehrani et al in "Tracking Forecast Memories in Stochastic Decoders" (Proc. IEEE Conf. Acous. Speech and Sig. Proc., 2009, hereinafter Tehrani (3)) introduced the concept of tracking forecast memories (TFMs) to extract the mean of regenerative bits, as a replacement for edge-memories. They have the advantage of a lower hardware complexity, but do not improve the performance of the decoder, which remains approximately 0.5 dB away from 32 iterations floating-point SPA.

Figure 3:
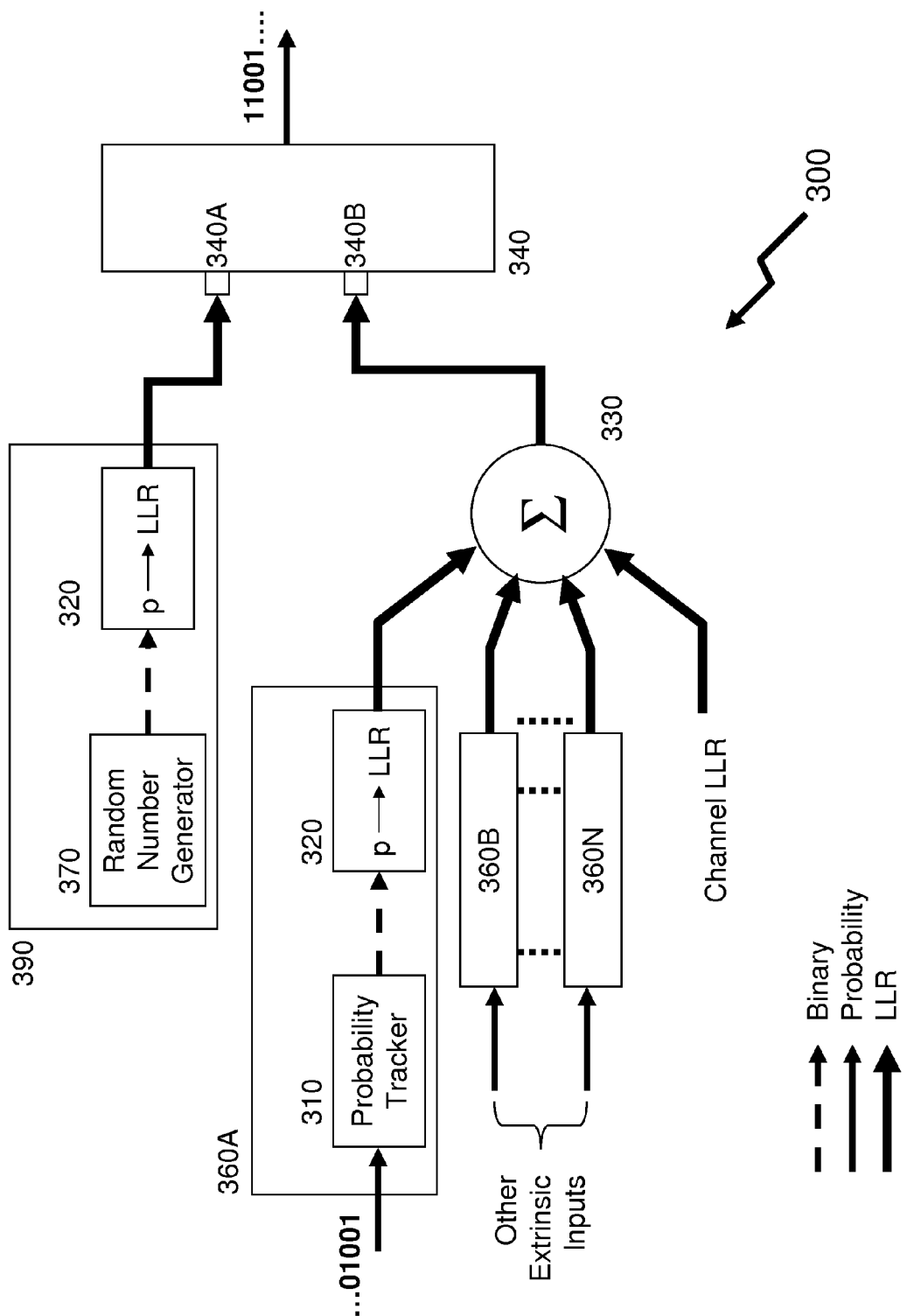
FIG. 3 depicts a variable node configuration for use in an encoder according to an embodiment of the invention.

RHS Algorithm:

As was noted in Tehrani (1) and Tehrani (3) it is likely that the gap between the performance of floating-point SPA and of stochastic decoding is due to the variable node implementation. The RHS algorithm, according to embodiments of the invention, improves the accuracy of the variable node operation by extracting the information in the stochastic stream and performing exact operations in the LLR domain. By exact operations it is meant that the variable node function of the SPA is used directly. The rest of the decoder remains stochastic, and information is exchanged between variable and check nodes in the form of stochastic streams. The RHS variable node is constructed by modifying an SPA variable node to handle incoming stochastic streams and convert them to LLR values, and to be able to generate the stochastic streams at the output. The resulting functionality of the variable node 300 is illustrated in FIG. 3 and is described in the following paragraphs. As shown in FIG. 3 a summation node 330 receives LLR values from a plurality of LLR generators 360A through 360N that are each associated with a different input data stream. The output of the summation node 330 is coupled to one input 340B of a comparator 340. Also coupled to the summation node 330 is a connection providing a channel LLR, which is computed from the channel output according to Equation 8. Each LLR generator 360A through 360N, for example LLR generator 360A, comprises a Probability Tracker 310 which receives the data steam for that extrinsic input and converts it to a probability that is then provided to a Probability to LLR converter 320 that then provides the LLR output to the summation node 330 associated with its extrinsic input. The second input 340A of the comparator 340 is connected to a uniform random number generator 390 comprising a random number generator 370 and a Probability to LLR Converter 320.

Converting Stochastic Streams to LLR Values:

At the inputs of the variable node 300, stochastic streams are converted to LLR values. First, the probability value that is embedded in the stochastic stream must be estimated, using Probability Tracker 310, and second, that probability must be converted to the LLR domain, using Probability to LLR converter 320. For implementing the Probability Tracker 310 a similar construction to that used by Shafiri Tehrani et al in "Tracking Forecast Memories in Stochastic Decoders" for the TFMs at the output of the stochastic variable node can be used. This function is also known as an exponential moving average and is a well-known first-order tracking filter. It is expressed according to an embodiment of the invention by Equation 18 below:

$$p_i = (1 - \beta_{RHS}) p_{i-1} + \beta_{RHS} b_i \quad (18)$$

It generates an estimate of the current probability $p_i$ by updating the previous estimate $p_{i-1}$ according to the received bit $b_i$. The relaxation factor $\beta_{RHS}$ controls the sensitivity of the Probability Tracker 310 to new information. Within this specification it will be referred to as the relaxation factor, for ease of reference against the successive relaxation (SR) algorithm discussed supra, see for example Hemati and Ortega et al in "Iterative Solution of Nonlinear Equations in Several Variables" (Academic Press, 1970).

Unlike the conventional SPA where a node's outgoing messages are replaced completely on each cycle, the SR algorithm establishes the node's next outgoing message, $\rho'_C$, in dependence upon the previous outgoing message, $\rho'_C$, the determined result for the node $v_C$, and $\beta_{SR}$ the relaxation factor, according to the following relationship $\rho_C = \rho'_C + \beta_{SR}(v_C - \rho'_C)$. The SR algorithm thereby utilizes its relaxation factor, $\beta_{SR}$, in the generation of the output message of the node after processing, whereas the RHS algorithm exploits its relaxation factor, $\beta_{RHS}$, in generating the current probability $\rho_i$ for the Probability Tracker 310 associated with each respective input stream at the extrinsic input of the node.

The relaxation factor $\beta_{RHS}$ controls the weight of the current stochastic bit in determining the current probability estimate. Because it controls the sensitivity of the probability estimate, it sets a bound as to how fast the entire iterative decoder can converge to a codeword. Accordingly reducing $\beta_{RHS}$ while increasing the iteration limit has the effect of improving the decoding performance, until it reaches the optimal continuous-time performance It can also be shown that under a limited number of iterations, there exists an optimal $\beta_{RHS}$ in terms of performance. According to analysis and simulations performed by the inventors, and hence according to embodiments of the invention, it is possible to optimize the average response of the decoder to obtain a higher throughput at the same signal-to-noise ratio (SNR) and frame error rate, by changing the value of $\beta_{RHS}$ after a number of cycles.

Generating Output Streams:

The output messages in the LLR domain are computed by converting all input probabilities to LLR values, using Probability to LLR Converter 320, and performing the necessary addition, using summation node 330. The outputs must then be converted to stochastic streams. Each bit of a stochastic stream is generated by comparing the desired expected value, provided at the output of summation node 330, with a uniform random number generated by the uniform random number generator 390. Depending on the result of the comparison, a 1 or a 0 is output. The expected value of the stream being in the probability domain, one way to generate an output bit is to convert the output LLR to the probability domain, and then compare that probability value with a uniform random number. Equivalently, the random number can be converted to the LLR domain, and compared with the output LLR. The latter is preferred because many stochastic output bits can be generated from the same random number. In fact, only a small number of independent random number generators (RNGs) are needed in a complete stochastic decoder.

Optimizations:

It would be desirable to determine how to achieve the optimal binary message passing decoding algorithm, in terms of average number of decoding cycles, latency and error rate. Accordingly there is presented a framework for optimizing some aspects of the RHS algorithm. As mentioned previously, the relaxation factor $\beta_{RHS}$ (hereinafter simply referred to as $\beta$) can be varied throughout the decoding process, and has been observed by the inventors to provide increased throughput. The use of multiple relaxation factors can be thought structurally as being similar to Gear-Shift Decoding, see M. Ardakani et al in "Gear-Shift Decoding" (IEEE Trans. Comms, Vol. 54, No. 7, pp 1235-1242) wherein the algorithm used by the decoder can be changed during decoding. Using the notation of Ardakani, the relaxation in the RHS algorithm can be generalized as a sequence $\{\beta_1, \beta_2, \ldots, \beta_k\}$, which is interpreted as using $\beta_1$ for the first cycle, $\beta_2$ for the second, and so on, until cycle k, which corresponds to the maximum number of cycles, is completed. This sequence can also be written in a more compact form as $\{\beta_1^{m(1)}, \beta_2^{m(2)}, \beta_3^{m(3)}, \ldots\}$, where the exponents m(i), indicate the number of consecutive cycles for which the relaxation factor $\beta_i$ is applied. The $\beta$ sequence may be optimized cycle-by-cycle using various methodologies, including for example extrinsic information transfer (EXIT) chart analysis as presented by Ardakani.

Another aspect of the RHS algorithm that can be optimized concerns the thresholds that are used in each variable node to generate the stochastic streams. Those thresholds do not necessarily have to be random, and therefore, for each cycle, it is possible to choose a deterministic threshold or a random threshold. In the same way we can consider a sequence $\{T_1, T_2, \ldots, T_k\}$, where each $T_i$ is either a deterministic or a random vector of length n, where n is the code length. The case of the first cycle illustrates that using a deterministic threshold can be beneficial. It is obvious that for the first cycle, the message bit that carries the most information about the transmitted bit corresponds to the hard-decision on the received value, and therefore we should use $T_1=0$.

Simulation Results:

The simulation framework is composed of a random source with an encoder, BPSK modulation/demodulation and an AWGN channel. All the simulations are performed with a maximum of 1000 decoding cycles using early termination. A decoding cycle corresponds to 1 bit being processed by the variable nodes, sent to the check nodes and sent back to the variable nodes. We note that a decoding cycle in a stochastic decoding algorithm is not equivalent to an iteration in a message passing algorithm such as SPA. The code used for the simulations is a (6,32)-regular RS-based LDPC code of size 2048 and rate 0.84, which has a girth of 6, see Djurdjevic et al in "A Class of Low-Density Parity-Check Codes Constructed based on Reed-Solomon Codes with Two Information Symbols" (IEEE Comms Lett., Vol. 7, Iss. 7, pp 317-319). This code was the one selected in the recent IEEE 802.3an standard for 10-Gb/s Ethernet over CAT6 cables. The decoder presented in this section uses floating-point representations.

Figure 4:
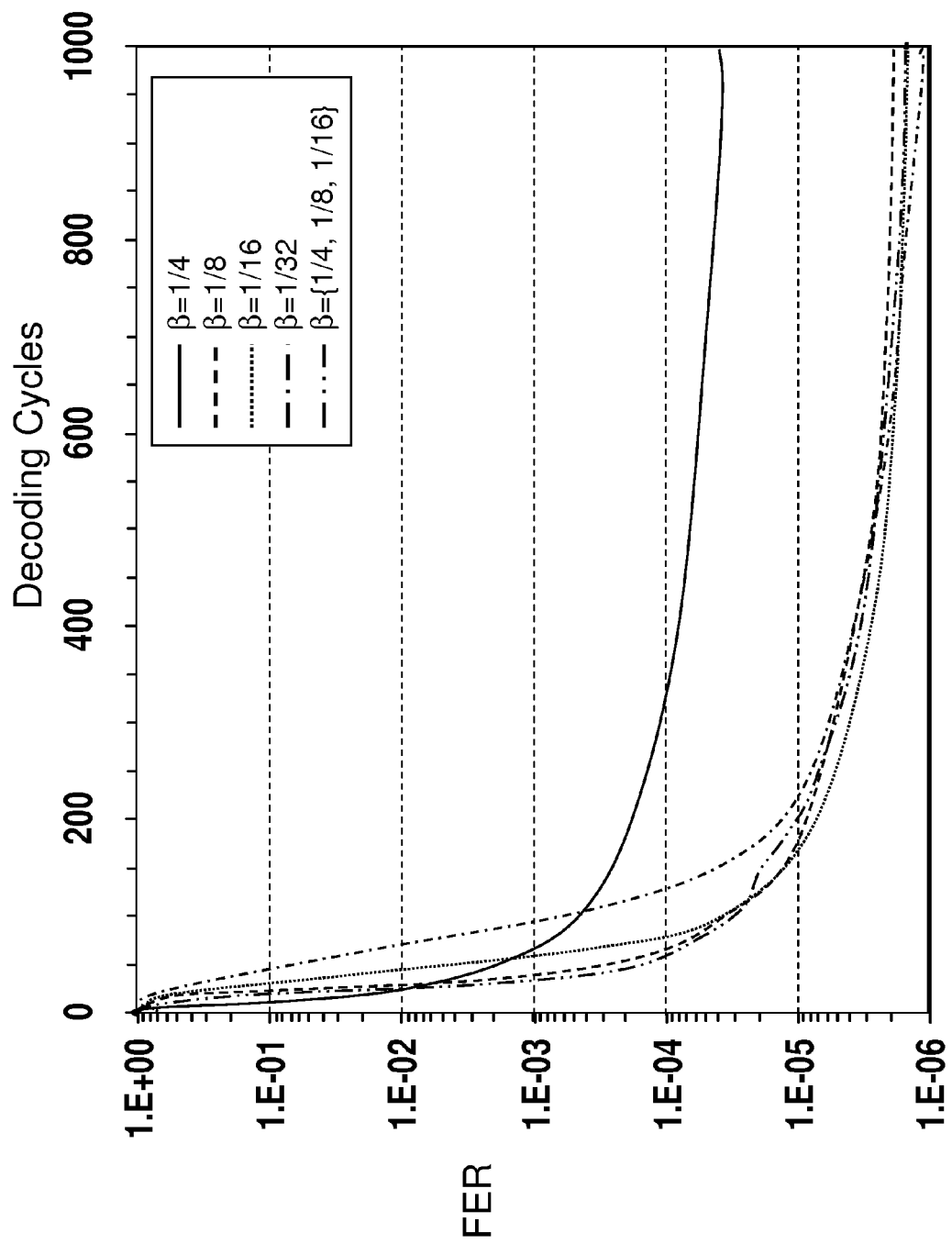
FIG. 4 depicts decoding convergence for a RHS decoder according to an embodiment of the invention.
Figure 5:
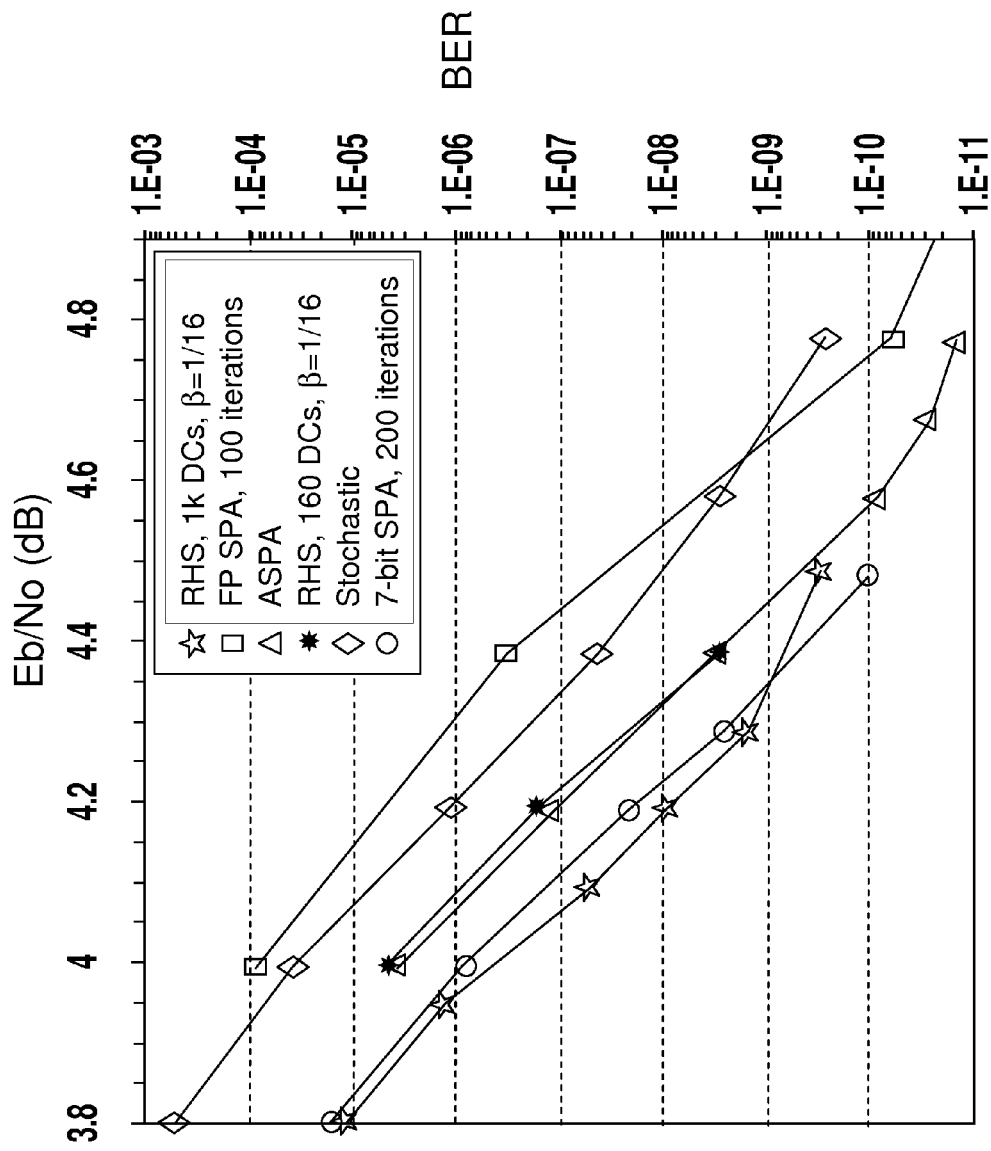
FIG. 5 depicts the BER performance of an RHS decoder according to an embodiment of the invention compared to prior art decoders.

The effects of the relaxation factor $\beta$ are illustrated by the settling curves presented in FIG. 4. The curves show the frame error rate of the decoder as a function of the maximum number of decoding cycles (DCs) at 4.2 dB. When the maximum number of DCs is between approximately 115 and 740, the best performance is obtained with $\beta=\frac{1}{16}$, while $\beta=\frac{1}{32}$ does a little bit better when the DC limit is above 740. On the other hand, the decoder converges faster on average for higher values of $\beta$, as shown by the initial part of the curves being further to the left. The average number of decoding cycles at 4.2 dB is 20 in the case of $\beta=\frac{1}{8}$, and 30 for $\beta=\frac{1}{16}$. By using $\{\beta_1=\frac{1}{4}, \beta_2=\frac{1}{8}, \beta_3=\frac{1}{16}\}$ in sequence over the course of the decoding process, this number can be reduced to 15 without any degradation in the decoding performance The curve shown in FIG. 3 uses $\{\beta_1^{34}, \beta_2^{76}, \beta_3^{890}\}$. It is evident from FIG. 3 that additional decoding cycles would provide little additional performance The BER performance of a RHS decoder according to an embodiment of the invention is shown in FIG. 5 in comparison with simulations of the performance of a 100-iteration floating-point SPA decoder with 5-bit demodulation. The curve referred to as "ASPA" is that generated by an "'offset approximate SPA" decoder with 4-bit quantization as presented by Zhang et al in "Lowering LDPC Error Floors by Post-Processing" (IEEE GLOBECOM 2008). Also presented in FIG. 5 is a 7-bit SPA implementation presented by Zhang et al in "Design of LDPC Decoders for Low Error Rate Performance" (IEEE Trans. Comm, Vol. 57, Iss. 11, 2009), as well as a stochastic decoder designed according to the architecture presented in Tehrani (2). This decoder is simulated with 64-bit edge-memories and a limit of 1000 decoding cycles. In the waterfall region, at a BER, of $10^{-8}$, the RHS decoder outperforms all the other decoders, but most importantly 100 iterations floating-point SPA. It is worth mentioning that simulations confirm that the RHS decoder matches the performance of optimized relaxed SPA when using a sufficiently small relaxation factor.

In FIG. 5 the slope of all BER curve starts increasing at higher signal-to-noise ratios. This phenomenon is known as the error floor and is presented in detail below along with a redecoding algorithm, which is an extension of the basic RHS algorithm that dramatically lowers the error floor. Simulation results are presented with a maximum of 1000 cycles, but this limit can be reduced. FIG. 5 also shows a RHS simulation that uses a limit of 160 cycles, which is sufficient to match the performance of the ASPA decoder. To compare the throughput of RHS and a MSA implementation such as the ASPA decoder, we can use the number of clock cycles required by each algorithm to perform one cycle or one iteration. This number, which is explained below in respect of Circuit Implementation, is 4 clocks/iteration for RHS and 13 clocks/iteration for the MSA. At 5.5 dB, the average convergence time for RHS is therefore 9.6 clock cycles (2.4 iterations, 4 clocks/iteration), while it is 19.5 clock cycles for MSA (1.5 iterations, 13 clocks/iteration). Hence, based on a rough estimation, a RHS decoder has a throughput twice as high as an MSA decoder.

It is evident from the results presented below in respect of error floors that the generalized relaxation factor sequence for the RHS algorithm, $\{\beta_1^{m(1)}, \beta_2^{m(2)}, \beta_3^{m(3)}, \ldots, \}$, may vary according to the LDPC code being decoded by the decoder. Additionally, the relaxation factor sequence may vary according to the degree of error correction required upon the received data, for example in accordance with the noise level within the transmission channel upon which the data is transmitted.

Accordingly, according to embodiments of the invention the relaxation factor sequence may be varied not only in dependence upon the coding standard employed but also upon the characteristics of the transmission channel itself or the data being transmitted. Optionally, the relaxation factor sequence employed may be dynamically adjusted during operation to account for variations of the transmission channel, i.e. for high SNR a sequence improving throughput or power consumption performance for example may be implemented that is then adjusted if low SNR is detected. Similarly, in a mobile application the relaxation factor sequence may be potentially adjusted according to the users usage or battery status of their mobile device, such that the relaxation factor sequence may be varied for example according to whether it is voice communications, data, or streaming audiovisual content or according to the charge status of the battery so that power is conserved in some situations by changing the relaxation factor sequence.

Circuit Implementation:

The main challenges in implementing the functionality of an RHS decoder are described below wherein the discussion only concerns the implementation of the variable node, since the interleaver and check nodes are straightforward and well known in the prior art. We will present the implementation in three parts; the front-end that converts stochastic streams to LLR values, the central SPA summation circuit, and the back-end that generates the outgoing stochastic streams.

Stochastic Stream Tracking:

As discussed above on the front-end of the variable node 300, each incoming stochastic stream must be converted to a LLR value. One way to do this is to track the probability value contained in the stream, and then convert that probability to the LLR domain, this being as depicted and discussed supra in respect of FIG. 3. According to another embodiment of the invention there is an alternative, which is to design a tracking mechanism that operates directly in the LLR domain The exponential moving average presented in Equation 18 becomes non-linear in the LLR domain, but the system can still be implemented by approximating the function with a piece-wise linear curve. A well-chosen two-piece linear approximation can be sufficient to obtain near ideal performance The linear fit may be optimized so that the multiplicative coefficients are easily implemented, either in the form of a shift operation, or if the coefficient is greater than ½, as a shift and subtract. The exact equation that was selected for the simulations is shown below in Equation 19. T is the point on the x axis where the two lines intersect which for the case the current input bit is 1, $b=(0.001)_2$, $d=(0.100111)_2$, and $T=-1$. If the input bit is 0, the signs of those constants are reversed.

$$\Lambda_i = \Lambda_{i-1}/4 + b \text{ if } \Lambda_{i-1} < T \quad (19A)$$

$$\Lambda_i = \Lambda_{i-1} \Lambda_{i-1}/64 - d \text{ otherwise} \quad (19B)$$

Fixed-Point Summation:

The summation in the variable node is the same as the SPA decoder in the LLR domain (and the MSA). As in SPA, the adder's width is determined by the choice of quantization precision for LLR values (q bits), plus a number of bits to represent intermediate results. The resulting width is $q + \lfloor \log_2(d_v+1) \rfloor - 1$, where $d_v$ is the degree of a variable node. Experimental results have shown that the RHS algorithm can accommodate very well the use of low precision LLR values.

Stochastic Stream Generation:

Stochastic bits are generated by comparing an expected value to a random number. The mean function of stochastic streams is in the probability domain, and therefore the random number generator (RNG) must generate uniform random numbers in the probability domain Since the expected value is expressed in the LLR domain, the random number is converted to the LLR domain to perform the comparison. In practice, the random numbers will have a finite precision, and this defines the effective range of the random number generator (RNG), which is the range associated with the stochastic stream The smallest probability that can be generated by the RNG is given by $½^n$, where n is the bit width of the RNG. The upper bound of the LLR range is then $\log 2^n + \log(1-2^{-n})$. To cover a range of at least [−8, 8], the RNG needs 12 bits and the actual range is approximately [−8.3, 8.3].

The random values in the probability domain can be converted to the LLR domain using a look-up table (LUT), but indexing the table directly with the probability value results in a table with $2^{12}$ entries, which is impractical. However, the inventors have found that the that LLR values can be quantized on only 4 or 5 bits. In the case of a 4-bit quantization, there are only $2^3$ positive output values. Starting from the 8 entry LUT, we wish to devise an addressing circuit that takes a probability value input. As the LLR domain is logarithmic, taking the logarithm of the probability value can provide a good indexing mechanism. Considering a probability value p expressed in binary form and satisfying $0<p\leq½$, the integer part of the log in base 2 is easily obtained by counting the number of leading zeros before the first one. This generates 12 indexes, which can be further reduced to 8 by OR'ing index lines that map to the same quantized LLR value. If $p>½$, the same technique can be applied to 1−p while changing the sign of the resulting LLR value. By considering the random number as composed of a sign bit and of a probability value in the range $0<p\leq½$, the subtraction can be avoided. Table 1 below illustrates the LUT for the case of a 12-bit RNG and 4-bit LLR. The three dots indicate that all the other bits are "don't cares".

TABLE 1

LUT for a LLR-domain RNG

| Probability Value (Binary) | Mapped LLR Magnitude (Binary) |
| --- | --- |
| 0.1 ... | 000 |
| 0.01 ... | 001 |
| 0.001 ... | 010 |
| 0.0001 ... | 010 |
| 0.00001 ... | 011 |
| 0.000001 ... | 100 |
| 0.0000001 ... | 100 |
| 0.00000001 ... | 101 |
| 0.000000001 ... | 101 |
| 0.0000000001 ... | 110 |
| 0.00000000001 ... | 110 |
| 0.000000000001 ... | 111 |

Figure 6:
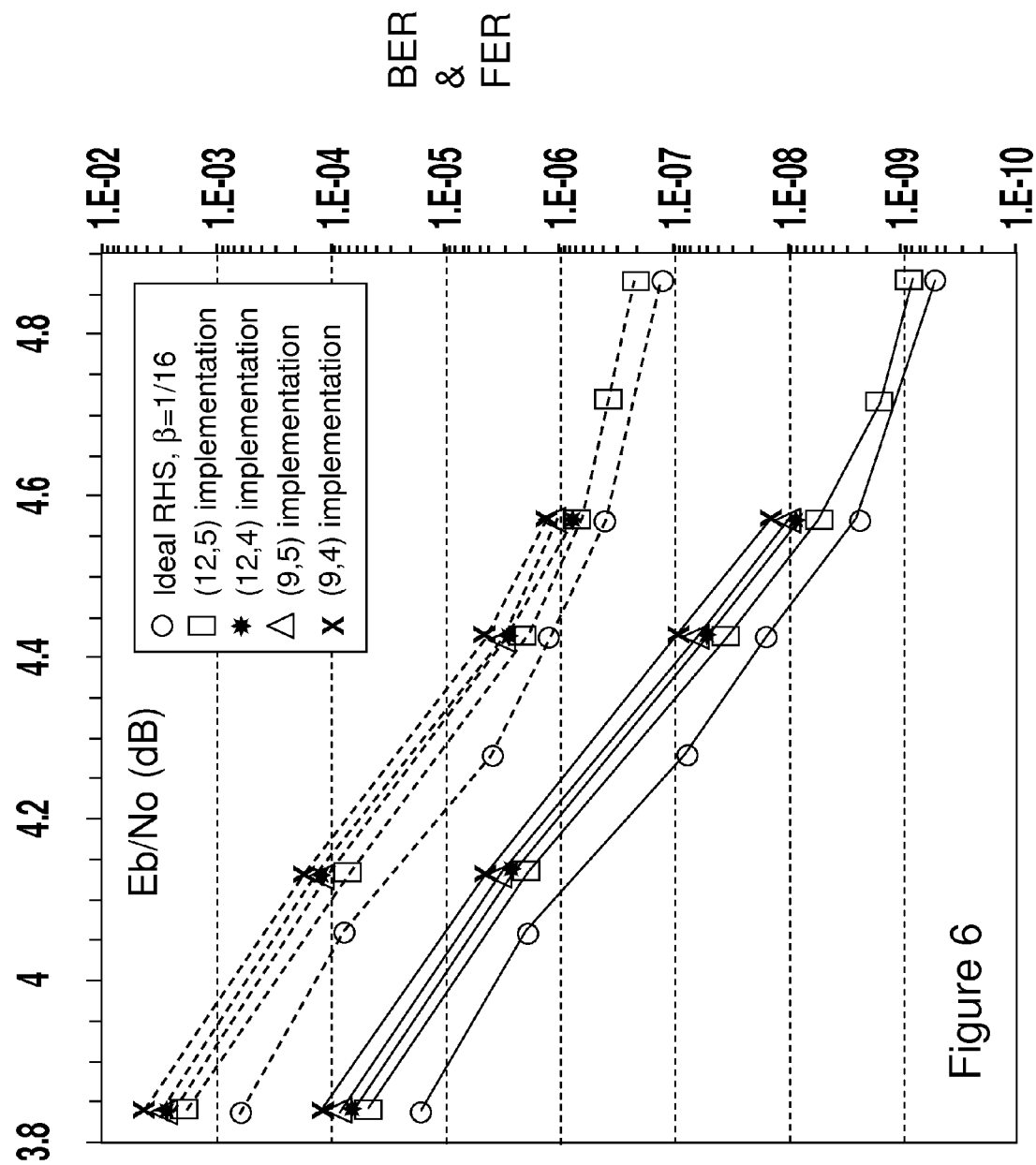
FIG. 6 depicts the performance of RHS decoders according to embodiments of the invention for various quantization precisions.

Simulation Results for the RHS Embodiment:

As with most decoders there exist possible tradeoffs with respect to the error correction performance and the implementation complexity. Two parameters are used to control the implementation's precision: the number of bits used to represent LLR values in the LLR tracker, and the number of bits used in the rest of the variable node. The LLR tracker has the role of an estimator for the stochastic stream, and therefore its precision has an impact on the precision of the information received through the stochastic stream In the rest of the variable node, the same representation is used for LLR values in the adder circuit and for the LLR-domain random number. The representations used for the simulations are 9-bit or 12-bit for the LLR tracker, and 4 or 5-bit for the other LLR values. FIG. 6 shows that the performance of the proposed circuit implementation is very close to the ideal case, even though LLR values are quantized on 4 or 5 bits. At a BER of $10^{-8}$, the (12, 5) implementation (12-bit LLR tracker and 5-bit quantization in the rest of the variable node) has a loss of only 0.04 dB. The throughput is as good as in the non-simplified decoder for all the implementation cases.

Complexity Analysis:

To consider the complexity of a decoder circuit implementing the RHS algorithm according to embodiments of the invention the Offset Min-Sum algorithm, which is widely use for circuit implementations of belief propagation because of its combination of lower complexity and good performance compared to SPA, is used as the basis of the comparisons. The basis for these comparisons being an area comparison in terms of 1-bit operations, and a circuit latency comparison based on the number of data-dependent operations in each iteration. It is important to note that the circuit latency in terms of operations per iteration does not directly translate into throughput, both algorithms need a different average number of iterations to converge. From the preceding throughput comparison the RHS algorithm offered approximately 100% improvement over the SPA method. Referring to Table 2 below the results of this complexity analysis are presented.

TABLE 2

Area and Latency Complexity of RHS versus Offset Min-Sum.

|  | Offset Min-Sum Q = 4 | RHS Q = 4, T = 9 | RHS Comparison |
|---|---|---|---|
| Area | 17.38 | 24.5 | 41% larger |
| Circuit Latency | 13 | 4 | 3.25 times faster |

The number of bits used to quantize LLR values is denoted by Q, and the size of the LLR trackers in the RHS algorithm is denoted by T. The average degree of variable nodes and check nodes is respectively $d_v$ and $d_c$. We use $V(d_v,Q)$ to denote the complexity of the SPA variable node in terms of operation-bits, which is complexity shared among all algorithms. The sum of all inputs is computed using an adder tree, from which the intrinsic information is subtracted using $d_v$ adders. A balanced binary tree with x leaves has $Tree(x)=x-1$ internal nodes. The number of adders is therefore $Tree(d_v+1)+d_v=2d_v$. To correctly compute a saturating sum of $(d_v+1)$ signed inputs, the circuit must be able to represent the value $$\left\lceil \frac{1}{2}(d_v+1) \right\rceil U,$$

where U is the biggest input allowed. This is because the worst case is for half the inputs to be saturated at the upper bound, and the other half at the lower bound, in which case the circuit must correctly output. The number of bits required for this representation is $Q'=Q+\lceil \log_2(d_v+1) \rceil -1$.

Out of all the adders in the variable node, some in the adder tree do not need the full precision of Q' bits. However the derivation of a general expression for the number of adder bits is rather involved, and hence by way of example we will just consider a specific case related to the 10-Gb/s Ethernet code used in the simulations. For a degree-6 variable node using a Q=4 bit quantization, the number of adders required is 12. The number of adder bits required in the 7-input adder tree is 6Q+9. The other 6 adders need a total of 6Q'. The common complexity of a degree-6 VN is therefore $V(6,Q)=6Q+6Q'+9$. For Q=4, V(6,4) equals 69 add For the Offset Min-Sum algorithm, finding the two smallest values among the check node inputs requires $3Tree(\lceil d_c/2 \rceil)=3(\lceil d_c/2 \rceil)-1$ operations, each Q bits wide. Adding the offsets requires 2Q adder bits. To combine the complexity of the Variable Node and Check Node, we can measure the complexity normalized per edge of the code graph. The total complexity, including the Variable Node, is therefore given by Equation 20.

$$\frac{V(d_v, Q)}{d_v} + \frac{3Q(\lceil d_c/2 \rceil - 1) + 2Q}{d_c} \quad (20)$$

Accordingly, the RHS VN needs $d_v T$ adder bits for the LLR trackers and $d_v Q$ comparator bits for the stochastic stream output. The total per edge area complexity of the RHS algorithm is therefore given by Equation 21 below.

$$\frac{V(d_v, Q) + d_v(T+Q)}{d_v} = \frac{V(d_v, Q)}{d_v} + T + Q \quad (21)$$

For $d_v=6$, $d_c=32$, Q=4, and T=9, the per-edge area complexity of the RHS algorithm is 24.5 operation-bits/edge. The area complexity of the Offset Min-Sum algorithm is 17.38 operation-bits/edge. RHS has therefore 41% higher area complexity, but this doesn't account for the interleaver, which has Q times less wires and thus reduced footprint and complexity.

Time Complexity:

The latency in the VN adder tree is common to all algorithms. It is given by $\lceil \log_2(d_v+1) \rceil$. For Offset Min-Sum therefore the latency of finding two minimum values using 2-input comparators is $2\lceil \log_2(d_c/2) \rceil +1$. Adding the offsets adds another level such that the check node latency is now $2\lceil \log_2(d_c/2) \rceil +2$, and the total latency is $\lceil \log_2(d_v+1) \rceil + 2\lceil \log_2(d_c/2) \rceil +2$.

The additional latency of the RHS algorithm is simply the LLR tracker addition and the output comparison. However by storing the current LLR total in each variable node, it is possible to hide the latency of the LLR tracker adder. Hence the total latency for RHS is $\lceil \log_2(d_c/2) \rceil +1$. For $d_v=6$ and $d_c=32$, the total latency of Offset Min-Sum algorithm is 13 cycles/iteration, while the total latency of RHS is 4 cycles/iteration.

Dealing with Error Floors:

The problem of error floors in LDPC codes was briefly discussed supra as an issue that has historically limited their performance at very low BER. The term "error floor" is a reference to the shape of the curves representing the error rate of channel coded transmissions as a function of signal-to-noise ratio wherein such curves would normally have a monotonically decreasing slope. However, due to limitations jointly introduced by the code structure and the decoding algorithm, the error rate is bounded by a secondary function that causes the error rate curve to flatten out, thereby preventing the transmission from reaching very low error rates. The inventors have established a novel technique for lowering error floors based upon application of a randomized algorithm that is an extension to embodiments of the invention using the RHS algorithm. However, the concept of a randomized decoding trajectory according to embodiments of the invention for lowering error floors can be applied to other relaxed belief propagation algorithms.

Trapping Sets and Error Floors:

The existence of cycles within a code graph can sometimes create sub-graph topologies that are detrimental to belief propagation algorithms. Richardson in "Error Floors on LDPC Codes" (Proc. 41st Allerton Conf. Comms Control and Computing, Monticello, 2003) introduced the term trapping set to describe those sub-graphs wherein a received bit is said to be eventually correct if there exists an I such that the bit i is correct for all iterations, i.e. i>I. A trapping set is defined as a set of received bits that are not eventually correct and that, together with their neighboring check nodes, form a connected sub-graph. The fact that the bits are not eventually correct implies that the decoding algorithm is not making progress, either because it has reached a stable point, or because it is oscillating (in which case the union of the oscillating states can be defined as a stable point). Of course valid codewords are also stable points, and for this reason invalid stable points can be referred to as pseudo-codewords.

The sub-graph of a trapping set is composed of the variable nodes that are not eventually correct, plus all the neighboring check nodes. Since the check nodes compute a parity-check equation, those having an even degree with respect to the sub-graph will be satisfied, and those having an odd degree will be unsatisfied. An (a,b) trapping set is defined as having a variable nodes and b odd degree check nodes (with respect to the sub-graph). In the following discussion the notation of Zhang will be used for simplicity.

The set of variable nodes involved in the trapping set is denoted D. O(D) and E(D) are the set of check nodes adjacent to D that have respectively odd and even degrees with respect to D, and the neighborhood set N(D) is the set of all variable nodes adjacent to check nodes in O(D), with the implication that $D \subset N(D)$. The probability of decoding error is lower bounded by the probability that some erroneous received bits form a trapping set of the code. Since we assume a memoryless channel, this probability is a function of the a-priori bit error rate, which decays much slower than the coded error rate for the signal-to-noise ratios of interest. However, on the AWGN channel there is no simple relationship between the received values and convergence of the decoder to a pseudo-codeword (which produces a decoding failure). Trapping sets can be viewed as structures that reinforce existing errors on a group of bits. Intuitively, if the errors in the set are not too strong while the values in N(D)\D are very reliable, it is possible that some bits in the set are corrected before the incorrect messages become too strong and that convergence to the pseudo-codeword is avoided. Furthermore, the decoding trajectory can be affected by errors outside the trapping set, for example by making a check node in E(D) be unsatisfied.

Figure 7:
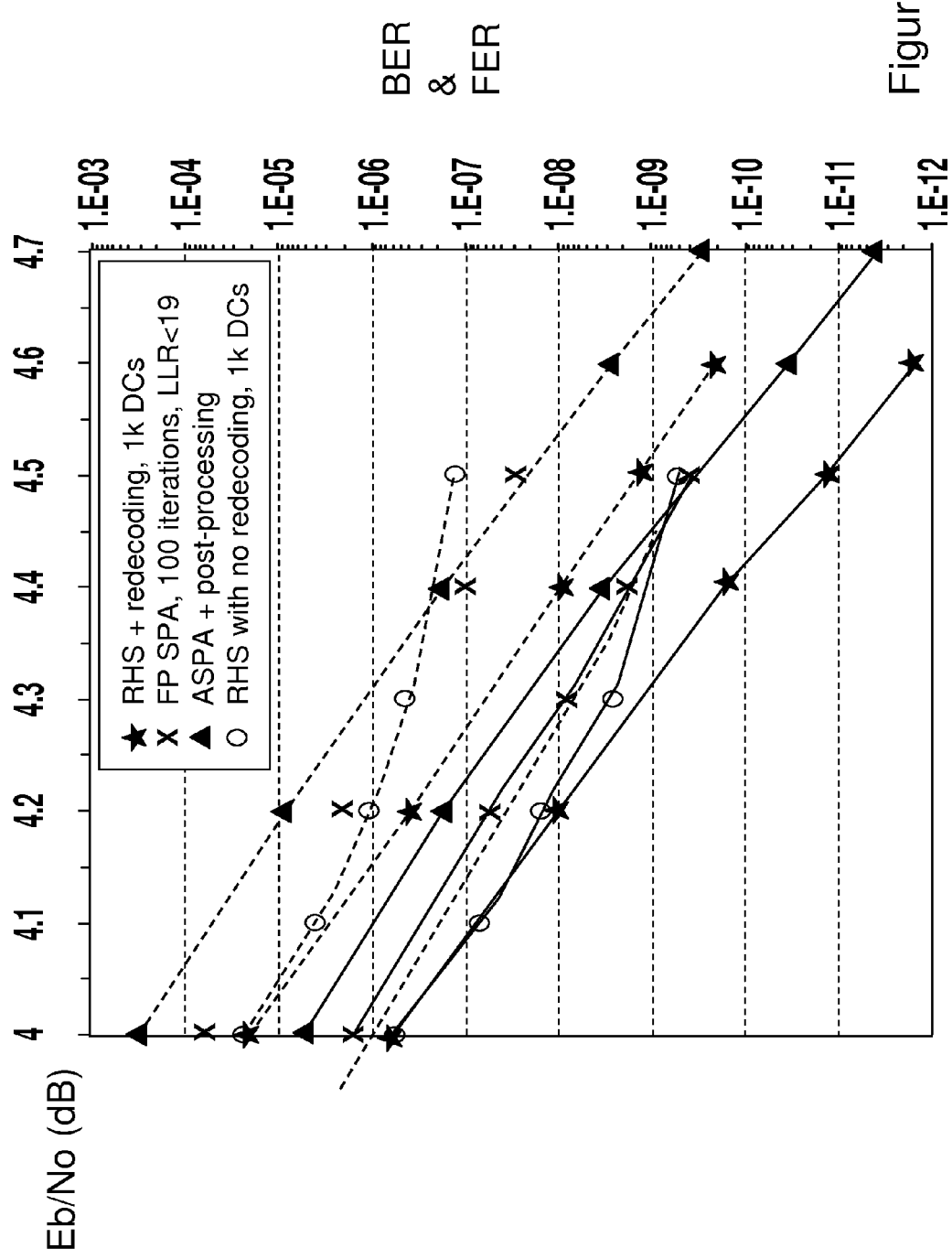
FIG. 7 depicts BER/FER performance for an RHS decoders according to an embodiment of the invention with and without redecoding against a floating-point SPA decoder.

We define the trajectory of a decoder as the sequence of states that it traverses until it terminates. The state space can be generalized for all algorithms as the space of all $n(d_v+1)$ variable node inputs. Depending on the algorithm several possible trajectories exist that go from a given initial state to a final stable state, whether this final state forms a codeword or a pseudo-codeword. Convergence to a pseudo-codeword depends on two competing characteristics of trapping sets, firstly the amplification of the set-intrinsic information caused by positive feedback loops and secondly by the extrinsic information flow into the set. By limiting extrinsic information flow into the set, the saturation of messages within the decoder to a certain range increases the effect of trapping sets. Referring to FIG. 7 the results of simulations of the SPA method with different limits on LLR messages exchanged in the decoder are shown. A lower limit increases the FER in the floor region (at higher SNR). The strength of a trapping set can be characterized by the average gain that is applied at each iteration to set-intrinsic information in the variable nodes of D (neglecting the effect of messages from O(D)). This is simply the average number of edges connecting a variable node in D to check nodes in E(D), and is given by Equation 22 below.

$$G = d_v - 1 - \overline{d_o} b/a \tag{22}$$

where $\overline{d_o}$ is the average degree of the check nodes in O(D) with respect to D. This expression is introduced by Schlegel et al in "On the Dynamics of the Error Floor Behaviour in (regular) LDPC Codes" (IEEE Trans. Inf. Theory, Vol. 56, Iss. 7, 2010) with $\overline{d_o}=1$. When some errors form a trapping set, the erroneous information is multiplied by G at each iteration. Therefore, as the iterative decoding progresses, the trapping set errors become harder to correct.

Prior Art Solutions:

Within the prior art several deterministic algorithms have been proposed to resolve decoding failures caused by trapping sets. These solutions have a common aspect in that they perform the decoding in two phases. The first phase uses a standard belief propagation algorithm. If the decoding is successful after the first phase, the algorithm terminates. Otherwise, the algorithm enters the second post-processing phase that is designed to handle trapping sets. Optionally, the syndrome weight (i.e. the number of unsatisfied check nodes) can be used to determine whether the failure was caused by a trapping set, and to decide whether to activate the second phase. This is based on the heuristic notion that if a received frame is too noisy to be decoded successfully, it is unlikely that the decoder will make much progress, while if a frame was received with a manageable error, only a convergence to a pseudo-codeword can cause some parity-checks to remain unsatisfied after many iterations. Therefore, a relatively small number of unsatisfied checks remaining after the first phase is indicative of convergence to a pseudo-codeword. Three common post-processing techniques that have distinctive characteristics are local search, erasure decoding, and altering messages.

Local Search:

Considering initially the local search approach then [30] presents a local search approach to breaking trapping sets, based on the knowledge of the unsatisfied check nodes and of the adjacent variable nodes. During the first phase, the algorithm keeps track of the minimum number of unsatisfied check nodes. When the decoding algorithm fails on a frame, this minimum is used to decide whether the failure was caused by a trapping set, by comparing it with a pre-determined threshold. When a trapping set failure is identified, the algorithms enters the second phase in which the a-priori LLR of some variable nodes are modified. The intention is to flip the a-priori hard-decision corresponding to the set D of variable nodes that are part of the trapping set, but the only information available is the composition of the set O(D) of unsatisfied check nodes.

The algorithm uses the assumption that all check nodes in O(D) have degree 1 with respect to D, and marks some variable nodes that form a matching set of O(D), which is defined as a set of variable nodes that are respectively adjacent to one and only one check node in O(D). The a-priori hard-decision corresponding to the marked variable nodes is then flipped by saturating the a-priori LLRs with the opposite sign, and the decoding is attempted again. The process is repeated until the decoding converges.

The inventors note that this process can be sped up by only considering a two-element subset of O(D) in cases where $|O(D)|>2$, because flipping only 1 or 2 bits in D typically allows the decoding to converge.

Each unsatisfied check node can yield one variable node from D. Hence searching for one node in D has a time complexity of $d_c$, searching for two nodes has a complexity of $d_c^2$, and so on. At each of the search step, the decoding algorithm must be run for at least a few number of iterations, resulting in an overall time complexity that is very high. However the fact that the second phase is allowed to use multiple trials remains an interesting aspect of this algorithm with respect to the other two.

Erasure Decoding:

The underlying idea of erasure decoding as presented by Han et al in "Low-Floor Decoders for LDPC Codes" (IEEE Trans. Comms Vol. 57, Iss. 6, 2009) also consists in modifying some received a-priori likelihoods in the second phase to eliminate the effect of the trapping set, but an erasure decoding algorithm is used instead of belief propagation. Using erasure decoding has the downside that all variable nodes in D must be erased. In contrast, when using belief propagation both Zhang and Kang et al in "A Two-Stage Iterative Decoding of LDPC Codes for Lowering Error Floors" (IEEE GLOBECOM, 2008) note that correcting 1 or 2 nodes in D is typically sufficient for the trapping set feedback to collapse. Consider defining an extension of the set N(D) defined above as $N_i(D)$, the set of variable nodes at distance of 2i−1 from check nodes in O(D), with $N(D)=N_1(D)$. The erasing algorithm needs to be modified depending on the topology of the trapping sets being targeted. If each node in D is connected to a node in O(D), it is sufficient to erase the nodes in $N_1(D)$. If this is not the case (for example if the trapping sets of interest have b<a), other levels $N_i(D)$, i>1, need to be erased. The inventors note that if too many nodes are erased, the erasure decoder will fail because the erasures form their own stepping sets, which are trapping sets on the binary erasure channel. Accordingly it is necessary for some exemplary trapping sets to use additional rules for selecting nodes to be erased.

Altering Messages:

Finally, as discussed by Zhang, the second phase algorithm is based on belief propagation and alters messages that are sent from check nodes to variable nodes, as opposed to changing the a-priori belief of the variable nodes. The authors note that the best way of altering the messages to resolve a trapping set situation is to increase the reliability of messages going from O(D) to D, while decreasing the reliability of messages originating from E. However D and E(D) are not known, so this scheme is not realizable. Accordingly it is proposed to increase the reliability of all messages sent from O(D) to N(D), while decreasing the reliability of all other incoming messages in N(D). Although Zhang refers to the operations as reliability increase and decrease, their proposed algorithm actually consists in sending a fixed reliability $L_{strong}$ from O(D) to N(D) and a fixed reliability $L_{weak}$ from the other check nodes connected to N(D). Variable nodes in D will be instantly corrected if the condition established in Equation 23 is satisfied.

$$L_{strong} > (d_v-1)L_{weak}+L_{pr} \quad (23)$$

where $L_{pr}$ is the a-priori LLR (assuming nodes in D are connected at most once to O(D)). However, variable nodes in N(D)\D will also be flipped according to the same criteria. The algorithm relies on $L_{pr}$ being generally higher for nodes in N(D)\D, and on the fact that newly introduced errors can be corrected with additional iterations of the regular belief propagation algorithm. Further iterations can also potentially correct the variable nodes in D that were not corrected instantly.

Values $L_{strong}$ and $L_{weak}$ must be adjusted based on the knowledge of the dominant trapping set. Nonetheless, the authors report very low BER performance on the 10 Gbs Ethernet code, as evident from FIG. 7 where the approach is shown plotted against floating-point SPA and an embodiment of the invention for redecoding, which suggests that their post-processing technique can break most trapping sets. The technique might however have some limitations in the context of irregular codes, where it might become harder to identify suitable perturbation values that would resolve trapping sets without injecting too many additional errors.

Breaking Trapping Sets with Randomized Redecoding:

As discussed supra the convergence to a pseudo-codeword essentially depends on the result of a race between extrinsic information flow into the trapping set and the amplification of set-intrinsic information. The problem of preventing an iterative belief propagation decoder from converging to a pseudo-codeword can be rephrased as the problem of altering the trajectory of the decoder so that the set-extrinsic information "wins the race".

Accordingly, the inventors have developed an extension to the RHS algorithm that provides for randomization of the trajectory of the decoder during the decoding sequence until convergence to a codeword is detected. Whilst embodiments of the invention are applicable to the RHS algorithm presented supra they may be employed with other decoding algorithms.

Redecoding:

The core idea behind redecoding is to try different random decoding trajectories until one converges to a codeword. Naturally, this must be done in an intelligent way, since decoders must work with a fixed latency budget. As discussed supra the decoding of a channel code can be reformulated as an optimization problem. Pseudo-codewords caused by trapping sets can then be viewed as local minima that must be avoided in the search for a global minimum, with the distinction that those local minima are actually caused by the decoding algorithm itself, and don't exist within the initial problem. Another important difference with a general optimization framework is that there exists a way to know whether the decoder has converged to a codeword, namely by checking that the syndrome is zero.

For the case of trapping sets in LDPC codes, we require a means to detect convergence to a non-global minimum, and also understand how a local minimum state (pseudo-codeword) relates to the global minimum (codewords). Hence, as discussed above several deterministic algorithms have been reported within the prior art to move the decoder out of a pseudo-codeword state. However, all these algorithms require some knowledge of the trapping set structure and hence are specific to the code employed. According to embodiments of the invention, however, redecoding does not depend on such knowledge, and in that sense is more general. Simulation results also support the general applicability of the redecoding technique, as it is shown to be successful for two different codes.

For stochastic optimization to find a global optimum in a high-dimensional search space it is beneficial to add some noise to the trajectory of an iterative optimization algorithm so that there is chance of avoiding local optima, while gradually reducing the noise to ensure that the algorithm eventually converges to the global minimum. Redecoding achieves this as the amount of noise on the trajectory is controlled by the value of the relaxation factor β. A higher value of the relaxation factor causes the variable node inputs to vary more widely as new bits are received.

According to embodiments of the invention therefore the redecoding algorithm may exploit the β sequence of the RHS algorithm introduced supra to start with a very noisy trajectory, and then reduce the noise as processing continues to allow the decoder to converge. The redecoding phase starts after the decoder has failed once. Therefore, according to embodiments of the invention, using a different β sequence specifically for redecoding process allows the optimization to break trapping sets.

Trapping Set Detection:

As discussed previously it is possible to detect that a decoder has converged to a pseudo-codeword by observing the number of unsatisfied parity-check equations. However, as redecoding is a randomized approach, many trials might be necessary for the decoder to successfully converge to a codeword. Observations on simulations by the inventors show that in the presence of received channel values that target a trapping set, the decoder typically converges quickly, within 10 to 40 cycles, to a stable pseudo-codeword state. Therefore, adding the ability to detect stable states makes the algorithm more efficient, as the redecoding trials can be performed within the normal operating cycle budget of the decoder.

The algorithm, according to an embodiment of the invention, detects a stable state by monitoring the minimum number of unsatisfied check nodes throughout the decoding. If this number remains stable for a pre-determined number of cycles, a stall is declared, which signals the decoder to initiate a new trial. In order to decrease the chance of falsely identifying a stable state, an additional criterion is set requiring that the number of unsatisfied check nodes be smaller than a threshold.

Simulations were run in software on a distributed computing platform to assess algorithms according to embodiments of the invention against the prior art. The simulation framework is the same as the one used for the RHS simulations presented previously. In order to assess the general applicability of the redecoding algorithm, simulations were run on two codes, each having a different rate and a different structure. The first code, from the 10 Gb/s Ethernet standard, was also used for simulations in respect of the embodiments of the invention relating to the RHS algorithm alone, without redecoding. The second code is a Progressive Edge Growth (PEG) construction, with a length of 1008 and rate 1/2 designed by Xiao-Yu Hu et al in "Regular and Irregular Progressive Edge-Growth Tanner Graphs" (IEEE Inf. Theory, Vol. 51, Iss. 1, pp 386-298, 2005), being regular in variable node degree, with $d_v=3$.

The behavior of the algorithm in the redecoding trials is controlled by the $\beta$ sequence and by the trapping set detection parameters, namely the limit on the number of unsatisfied check nodes and the number of stable cycles. The $\beta$ sequence, for the simulations, was optimized by hand by observing the performance of the decoder on a set of recorded frames that failed to decode in a single trial. To simplify the problem, the number of distinct $\beta$ values was limited to 3. The results are presented merely for the first sequence identified that decodes all the "trapping set" frames of the two codes. It would be evident to one skilled in the art that other sequences may provide improved performance without departing from the scope of the invention. It would be evident that automated optimization may be performed for a specific code or codes and these $\beta$ sequences employed for those codes with a decoder according to an embodiment of the invention. Alternatively, optimization to a $\beta$ sequence that performs across a wide code base may be established for a generic decoder applicable to multiple transmission standards.

For the 10 Gb/s Ethernet code, the $\beta$ sequence that was selected was $\beta=\{(0.75)^1,(0.25)^{20},(0.125)^{k-21}\}$, where k is the maximum number of cycles in a redecoding trial. However, the results obtained from the PEG code, see below, indicate that it might not be necessary to use lower $\beta$ values at all. For the trapping set detection parameters, the limit on unsatisfied check nodes was set at 30, and the number of stable cycles at 10. Those values were adjusted based on simulation results.

Referring to FIG. 7 the results are shown for BER and FER results for the 10 Gob/s Ethernet code. No error floor is noticeable down to a BER of $1.5\times10^{-12}$. A total of 10 errors were recorded at the SNR 4.6 dB. From that, 9 were undetected, and from those, 4 were ML errors, meaning that a Maximum Likelihood decoder would also have failed on those frames. From the 9 undetected errors, 7 were at a Hamming distance of 14 with respect to the transmitted codeword, and 2 at 16. This shows that the minimum distance of the code is no more than 14. It was shown by Schlegel that the minimum distance is at least 10. FIG. 7 also presents the results presented by Zhang for their post-processing technique, which was reviewed above in respect of prior art solutions.

Figure 8:
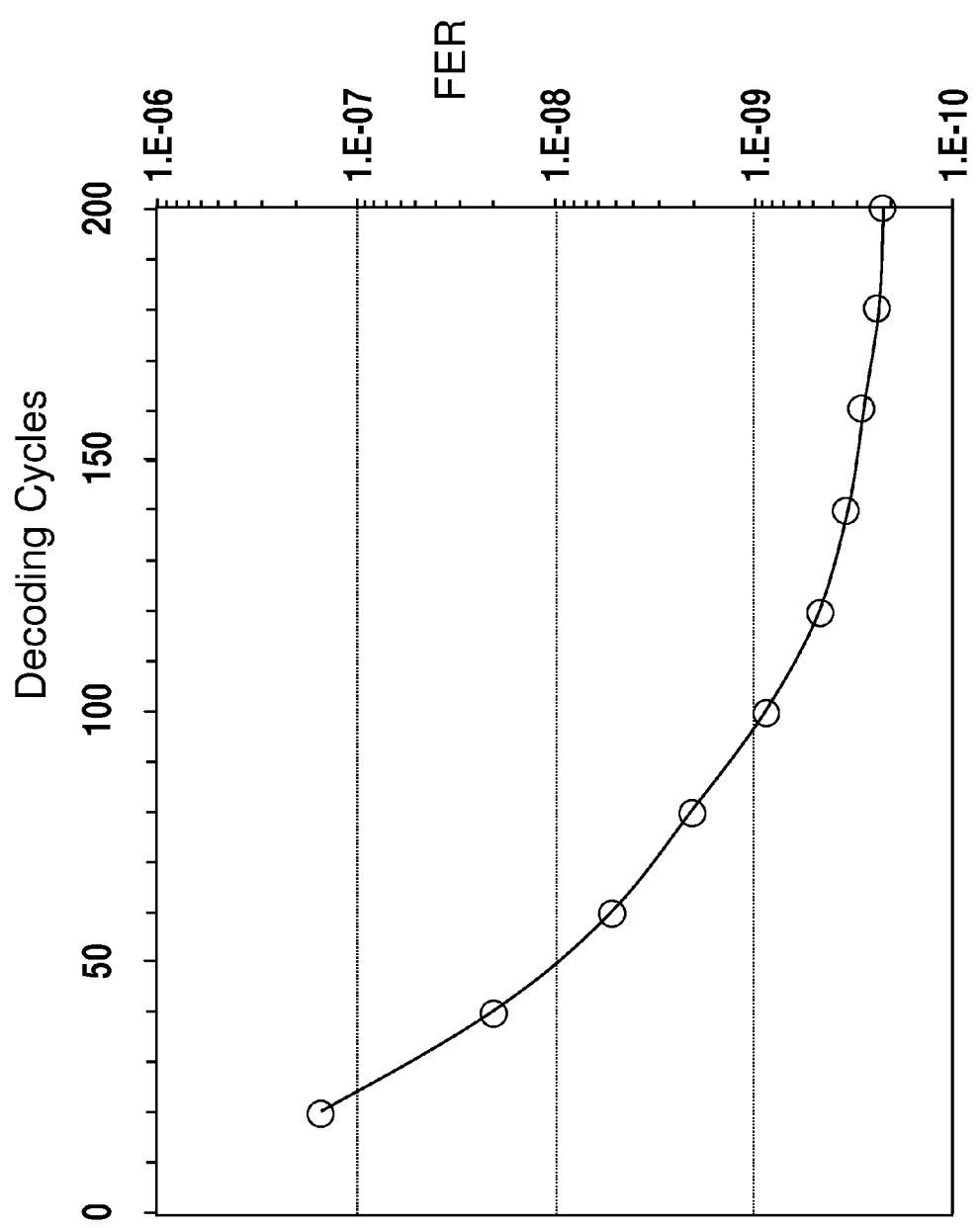
FIG. 8 depicts the FER performance of an RHS algorithm decoder according to an embodiment of the invention as a function of decoding cycles.

Referring to FIG. 8 the FER as a function of decoding cycles is presented for the 10 Gb/s Ethernet code based upon combining the redecoding with the RHS algorithm. From the codewords that were decoded using redecoding, the codeword that required the most trials used 23 trials and 594 cycles.

For the PEG code, the $\beta$ sequence was chosen as $\beta=\{(0.75)^1,(0.45)^{20},(0.2)^{k-21}\}$, the limit on unsatisfied check nodes was set at 20, and the number of stable cycles at 10. Here, even $\beta$ remains relatively high, it does not prevent "trapping set" frames from converging. This is most likely due to the fact that the decoder stops as soon as a codeword is found, and does not require the trajectory to stabilize, which differs from the cases discussed supra in respect of general optimization problems and prior art techniques.

Figure 9:
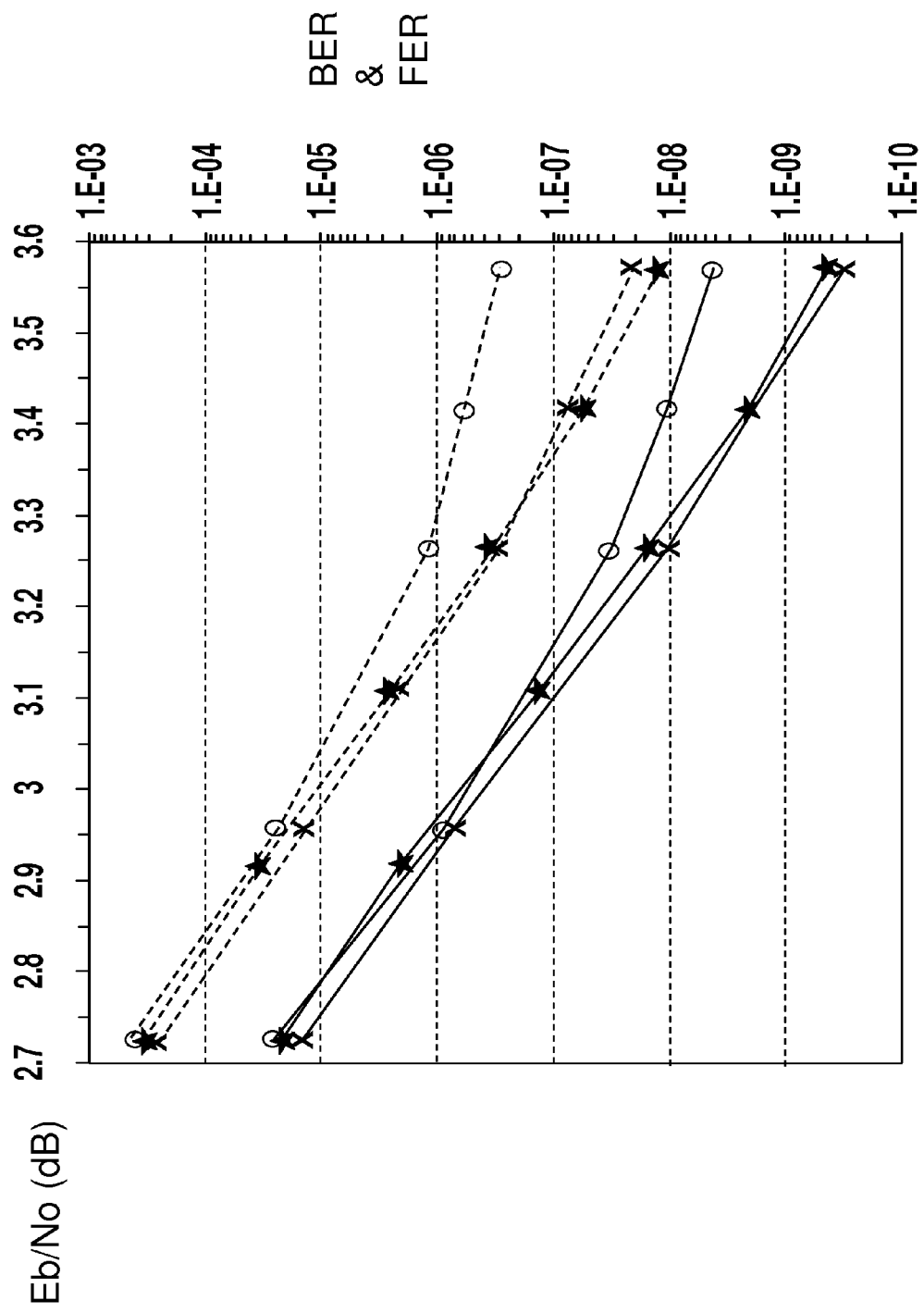
FIG. 9 depicts the BER/FER performance of RHS decoders according to an embodiment of the invention with and without redecoding against a floating-point SPA decoder for a PEG code.

Referring to FIG. 9 the BER and FER results for embodiments of the invention with and without redecoding are presented against the floating-point SPA algorithm for the PEG code. These results show that on this code as well, redecoding can improve the error floor by a large margin. A total of 41 errors were recorded at 3.6 dB, all of which were detected errors. The worst-case for the number of redecoding trials was 20 trials, corresponding to 654 cycles.

It is evident from the results presented above in respect of error floors that the generalized relaxation factor sequence for the RHS algorithm, $\{\beta_1^{m(1)}, \beta_2^{m(2)}, \beta_3^{m(3)}, \ldots\}$, may vary according to the LDPC code being decoded by the decoder and the performance level required from the decoder. Accordingly, the relaxation factor sequence may vary according to the degree of error correction required upon the received data. As such the approach allows for a generalized decoder circuit to be implemented that has application across multiple systems as either the relaxation sequence is varied according to whether low performance, e.g. error floor not addressed, or high performance, error floor addressed. Equally the general decoder may operate on multiple encoding standards based upon a change in the relaxation sequence.

Optionally, the relaxation factor sequence employed in a decoder employing redecoding may change the sequence according to SNR on the transmission channel, target BER for the data/application accessing the transmission channel, or a target latency. According to embodiments of the invention therefore a network operator may instruct a node in a system to use a particular relaxation factor sequence wherein the latency, BER, channel utilization etc are part of a service level agreement for example so that they can manage decoding in a manner hitherto not accessible to them.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device comprising:
at least a generator of a plurality of generators, each generator receiving extrinsic input data relating to a different transmission channel and applying a process to the extrinsic input data to generate first output data, the first output data generated in dependence upon the extrinsic input data and at least a first probability calculation and a relaxation factor;
a summation node connected to the plurality of generators to receive the plurality of first output data, receive a channel log-likelihood ratio, and generate summation result data;
a uniform random number generator to generate a second output, the second output generated in dependence upon at least a second probability calculation; and
a comparator generating a code in dependence upon the summation result data and the second output by comparing the summation result data with the second output.

2. The device according to claim 1, wherein providing the generator comprises:
providing a first converter that receives the extrinsic input data and generates a probability value therefrom; and
providing a second converter that receives the probability value from the first converter and generates first output.

3. The device according to claim 2, wherein the second converter is a log-likelihood ratio converter.

4. The device according to claim 1, wherein:
the device operates in dependence upon at least a clock signal; and
the relaxation factor comprises a relaxation factor array comprising a plurality of predetermined values and a count associated with each predetermined value of the plurality of values; and
each predetermined value is established for a predetermined number of clock cycles determined in dependence upon at least the count associated with the predetermined value.

5. The device according to claim 4, wherein the relaxation factor array is determined in dependence upon at least one of a characteristic of the transmission channel and the data.

6. A method comprising:
providing at least a generator of a plurality of generators, each generator receiving extrinsic input data relating to a different transmission channel and applying a process to the extrinsic input data to generate first output data, the first output data generated in dependence upon the extrinsic input data and at least a first probability calculation and a relaxation factor;
providing a summation node connected to the plurality of generators to receive the plurality of first output data, receive a channel log-likelihood ratio, and generate summation result data;
providing a uniform random number generator to generate a second output, the second output generated in dependence upon at least a second probability calculation; and
providing a comparator generating a code in dependence upon the summation result data and the second output by comparing the summation result data with the second output.

7. The method according to claim 6, wherein providing the generator comprises:
providing a first converter that receives the extrinsic input data and generates a probability value therefrom; and
providing a second converter that receives the probability value from the first converter and generates first output.

8. The method according to claim 7, wherein the second converter is a log-likelihood ratio converter.

9. The method according to claim 6, wherein:
the method operates in dependence upon at least a clock signal; and
the relaxation factor comprises a relaxation factor array comprising a plurality of predetermined values and a count associated with each predetermined value of the plurality of values, and
wherein each predetermined value is established for a predetermined number of clock cycles determined in dependence upon at least the count associated with the predetermined value.

10. The method according to claim 9, wherein the relaxation factor array is determined in dependence upon at least one of a characteristic of the transmission channel and the data.

* * * * *